US012733105B2

(12) United States Patent
Tuohimma et al.

(10) Patent No.: US 12,733,105 B2
(45) Date of Patent: Sep. 8, 2026

(54) TECHNIQUES FOR ADJUSTING OPTICAL PATHS VIA ANGLING OF OPTOELECTRONIC COMPONENTS

(71) Applicant: Oura Health Oy, Oulu (FI)

(72) Inventors: Mikko Pellervo Tuohimma, Kempele (FI); Jukka Tapani Makinen, Oulu (FI)

(73) Assignee: Oura Health Oy, Oulu (FI)

( * ) Notice: Subject to any disclaimer, the term of this patent is extended or adjusted under 35 U.S.C. 154(b) by 188 days.

(21) Appl. No.: 18/663,966

(22) Filed: May 14, 2024

(65) Prior Publication Data

US 2025/0358937 A1 Nov. 20, 2025

(51) Int. Cl.
*H05K 1/189* (2026.01)
*H05K 1/02* (2006.01)

(52) U.S. Cl.
CPC ............. *H05K 1/189* (2013.01); *H05K 1/028* (2013.01); *H05K 2201/10106* (2013.01); *H05K 2201/10121* (2013.01); *H05K 2201/10151* (2013.01); *H05K 2201/10522* (2013.01)

(58) Field of Classification Search
CPC ................... H05K 1/028; H05K 1/189; H05K 2201/10106; H05K 2201/10121; H05K 2201/10151; H05K 2201/10522
See application file for complete search history.

(56) References Cited

U.S. PATENT DOCUMENTS

2022/0096007 A1* 3/2022 Robinson ............... G16H 40/63
2023/0113714 A1* 4/2023 Vallius ................. A61B 5/7207 398/25
2023/0114269 A1* 4/2023 Heikkinen ........... A61B 5/6826 600/323
2024/0000328 A1* 1/2024 Kangas .............. A61B 5/02438
2025/0127439 A1* 4/2025 Connor ................ A61B 5/4875

* cited by examiner

*Primary Examiner* — Nathan Milakovich
(74) *Attorney, Agent, or Firm* — ArentFox Schiff LLP

(57) ABSTRACT

Methods, systems, and devices for a wearable ring device are described. In some cases, a printed circuit board (PCB) of a wearable ring device may include a first wing extruding from the PCB in a first direction and in accordance with a first angle between a bottom face of the first wing and a top face of the PCB, and a second wing extruding from the PCB in a second direction and in accordance with a second angle between a bottom face of the second wing and the top face of the PCB. In such cases, a light emitting component may be positioned on the first wing and a light detecting component may be positioned on the second wing, such that a first optical path may be defined between the first light emitting component and the first light detecting component based on the first angle and the second angle.

17 Claims, 7 Drawing Sheets

TECHNIQUES FOR ADJUSTING OPTICAL PATHS VIA ANGLING OF OPTOELECTRONIC COMPONENTS

FIELD OF TECHNOLOGY

The following relates to wearable devices and data processing, including techniques for adjusting optical paths via angling of optoelectronic components.

BACKGROUND

Some wearable devices may be configured to collect data from users. For example, a wearable device may include one or more sensors that collect various types of physiological data from a user. Some systems associated with the wearable devices may also be able to perform various actions, such as providing certain health insights to users.

DETAILED DESCRIPTION

Figure 1:
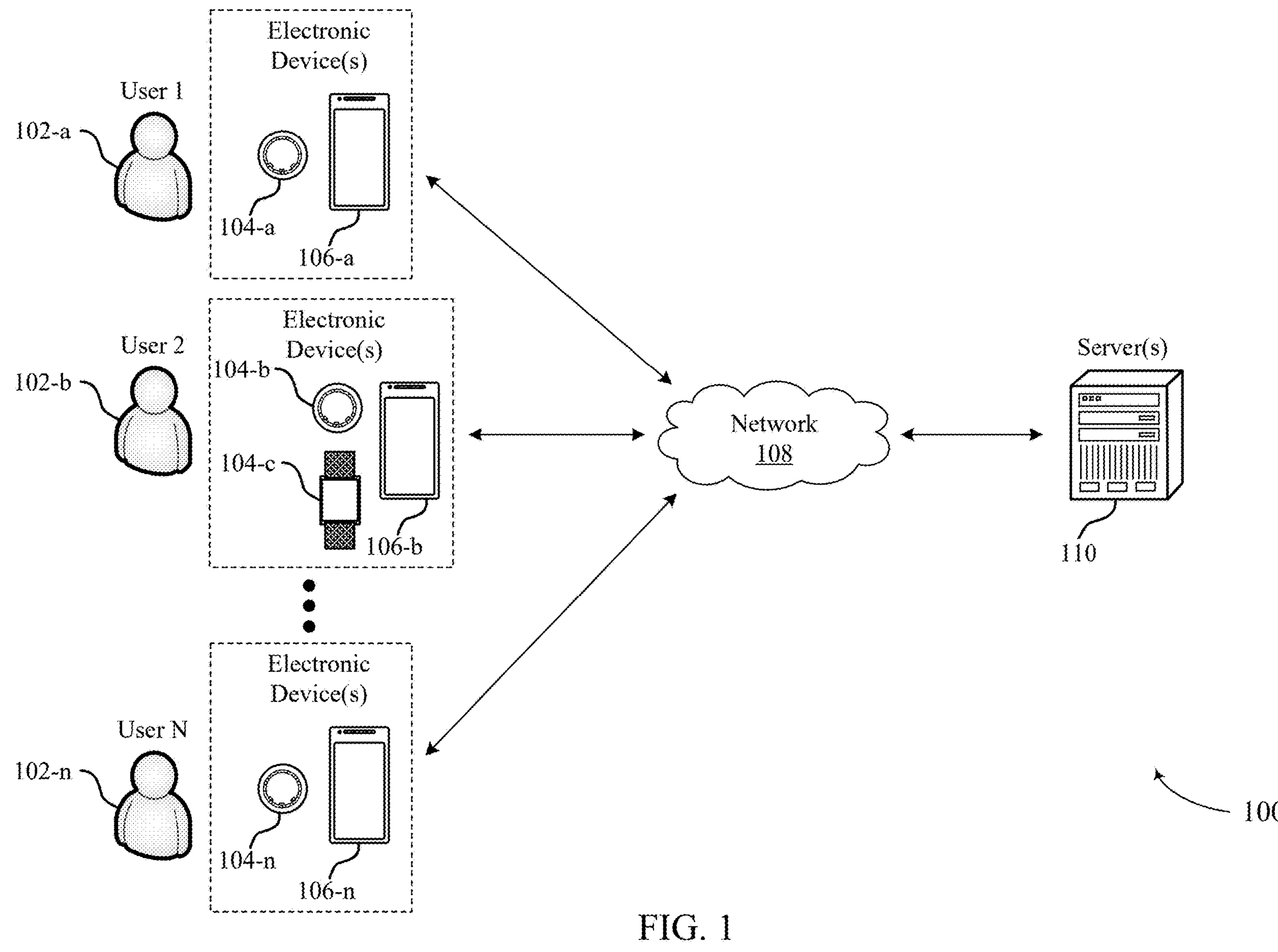
FIG. 1 illustrates an example of a system that supports techniques for adjusting optical paths via angling of optoelectronic components in accordance with aspects of the present disclosure.

Many wearable devices may be configured to collect physiological data from users, such as heart rate, blood pressure, blood oxygen saturation, and the like thereof. In such cases, the physiological data may be collected via a set of sensors. For example, a wearable device worn on a finger of a user, which may be referred to as a wearable ring device, may include one or more light emitting diodes (LEDs) and one or more photodetectors (PDs). In such cases, the one or more LEDs and the one or more PDs may be secured to a printed circuit board (PCB) that wraps (e.g., at least partially) around an inner circumference of the wearable ring device. Each LED and each PD may be secured to the PCB in a manner such that each LED and each PD is perpendicular (e.g., nearly perpendicular) to both the PCB and an inner housing of the wearable ring device. Thus, multiple optical paths may be formed between the one or more LEDs and the one or more PDs. That is, the one or more LEDs and the one or more PDs may form a set of LED-PD pairs, where each LED-PD pair includes an LED that may transmit light to a PD along an optical path through the finger of the user. For example, a first LED and a first PD may be positioned at a radial distance from each other on the PCB, such that the curvature of the PCB causes the first LED and the first PD to angle towards each other. Thus, light transmitted by the first LED may follow an arched optical path between the first LED and the first PD. Light transmitted along the multiple optical paths may be used by the wearable ring device to collect the physiological data from the user.

However, in some cases, a first optical path, associated with a first LED-PD pair of the wearable device, may intersect or be within a threshold proximity of a pulsating blood vessel of the user due to an arch of the first optical path. As such, for first physiological data, such as blood oxygen saturation, the pulsating blood vessel may be perceived as noise that may detrimentally affect accuracy of the first physiological data. Conversely, second physiological data, such as blood pressure and heart rate, may be based on the pulsating blood vessels. As such, the second physiological data collected via a second optical path, associated with a second LED-PD pair of the wearable device, that does not intersect the blood vessel or is not within the threshold proximity of the blood vessel due to an arch of the second optical path may be inaccurate. Additionally, or alternatively, an LED and a PD that are not intended to communicate with each other (e.g., are not part of an LED-PD pair, do not form an optical path) may be located within a threshold proximity of each other, such that the curvature of the PCB on which the LED and the PD are secured may result in interference between the LED and the PD.

Accordingly, techniques described herein may support a PCB with wing component, which may be referred to as wings, on which one or more LEDs, one or more PDs, or both, may be positioned, where each wing is set at an angle relative to the PCB to create desired (e.g., more direct, less arched) optical paths between the one or more LEDs and the one or more PDs. For example, a wearable ring device may include an inner housing defining an inner circumference of the wearable ring device and an outer housing defining an outer circumference of the wearable ring device. Additionally, the wearable ring device may include a PCB that wraps (e.g., at least partially) around the inner circumference of the wearable ring device, where the PCB includes one or more wings on which one or more LEDs, one or more PDs, or both, are positioned. In such cases, a wing may be an extrusion (e.g., made of PCB) from the PCB, where the extrusion is at least partially at an angle to a top surface (e.g., top face) of the PCB (e.g., surface facing the inner housing).

For example, the wing may be an extrusion from a side of the PCB that bends back over the top surface of the PCB to create the angle relative to the top surface. In some cases, the angle relative to the top surface may be based on an additional upward or downward bend of the wing. That is, in the unbent position, a first portion of the wing, which may be referred to as an arm, may be perpendicular to the side of the PCB and a second portion of the wing, which may be referred to as the angled component, may be parallel to the side of the PCB, such that, in the bent position, the arm of the wing may bend back over the top of the PCB (e.g., according to a first bend) and the angular component of the wing may bend upward or downward relative to the top surface of the PCB (e.g., according to a second bend), where the upward or downward bend results in the angular component forming the angle relative to the top surface. In some cases, the angular component may be bent upward (e.g., towards the inner circumference of the wearable ring device, away from the top surface of the PCB) at a first end of the angular component attached to the arm, such that the angle relative to the top surface is based on a distance between the top surface and a second end of the angular component (e.g., free end). In some other cases, the angular component may be bent downwards (e.g., away from the inner circumference of the wearable ring device, towards the top surface of the PCB) at the first end of the angular component attached to the arm, such that the angle relative to the top surface is based on a distance between the top surface and a portion of the arm that is bent back over the top surface.

In some other cases, the angle relative to the top surface may be based on the wing being bent back over the top surface of the PCB. That is, in an unbent position (e.g., when the entire wing is parallel to the PCB), the arm may be perpendicular to the side of the PCB and the angled component may be at a first angle relative to the side of the PCB, such that, in a bent position, the arm of the wing may bend back over the top of the PCB resulting in the angular component of the wing forming a second angle relative to the top surface of the PCB (e.g., without an additional bend). In such cases, the second angle relative to the top surface of the PCB may be based on the first angle relative to the side of the PCB.

Thus, in any case, an LED may be positioned on a first wing of the PCB and a PD may be positioned on a second wing of the PCB, opposite the first wing (e.g., mirroring the first wing), where a first angle of the first wing and a second angle of the second wing cause the first and second wings to angle towards each other. Thus, an arch (e.g., depth) of an optical path between the LED and the PD (e.g., an LED-PD pair) may be based on the first angle, the second angle, or both. In other words, optical path may be set to a desired optical path during manufacturing based on selection of the first angle, the second angle, or both, such that the LED-PD pair may be associated with an optical path that intersect pulsating blood vessels (e.g., for heart rate and blood pressure measurements) or may be associated with an optical path that do not intersect pulsating blood vessels (e.g., for blood oxygen saturation measurements).

Additionally, or alternatively, a PD and an LED positioned within the threshold proximity of each other may further be positioned on wings and the wings may be set at selected angles to avoid interference between the PDs and the LED. That is, in some cases, when an LED and a PD of an LED-PD pair are positioned within a first threshold proximity of each other (e.g., too short of a distance), a threshold quantity of light (e.g., too much light) may reflect from a top layer of skin of a user (e.g., that doesn't pulse), such that a signal to noise ratio (SNR) of a signal associated with the LED-PD pair may drop below a threshold SNR (e.g., SNR becomes too low for quality measurements). Thus, the LED and PD (e.g., within the first threshold proximity of each other) may be positioned on wings, where the wings are angled such that the optical path penetrates deeper into a finger of the user (e.g., as compared to the LED and the PD not being positioned on wings), reducing the quantity of light reflected from the top layer of skin of the user (e.g., improving measurement quality). In some other cases, an LED and a PD may not be part of an LED-PD pair but may be within a second threshold proximity of each other, such that light output by the LED may be received by the PD as interference. Thus, the LED, the PD, or both, (e.g., within the second threshold proximity of each other) may be positioned on one or more wings that are tilted away from each other, such that interference experienced by the PD is reduced.

Aspects of the disclosure are initially described in the context of systems supporting physiological data collection from users via wearable devices. Aspects of the disclosure are then described in the context of a wearable ring device, a PCB, and wing configurations. Aspects of the disclosure are further illustrated by and described with reference to apparatus diagrams, system diagrams, and flowcharts that relate to techniques for adjusting optical paths via angling of optoelectronic components.

FIG. 1 illustrates an example of a system 100 that supports techniques for adjusting optical paths via angling of optoelectronic components in accordance with aspects of the present disclosure. The system 100 includes a plurality of electronic devices (e.g., wearable devices 104, user devices 106) that may be worn and/or operated by one or more users 102. The system 100 further includes a network 108 and one or more servers 110.

The electronic devices may include any electronic devices known in the art, including wearable devices 104 (e.g., ring wearable devices, watch wearable devices, etc.), user devices 106 (e.g., smartphones, laptops, tablets). The electronic devices associated with the respective users 102 may include one or more of the following functionalities: 1) measuring physiological data, 2) storing the measured data, 3) processing the data, 4) providing outputs (e.g., via GUIs) to a user 102 based on the processed data, and 5) communicating data with one another and/or other computing devices. Different electronic devices may perform one or more of the functionalities.

Example wearable devices 104 may include wearable computing devices, such as a ring computing device (hereinafter "ring") configured to be worn on a user's 102 finger, a wrist computing device (e.g., a smart watch, fitness band, or bracelet) configured to be worn on a user's 102 wrist, and/or a head mounted computing device (e.g., glasses/goggles). Wearable devices 104 may also include bands, straps (e.g., flexible or inflexible bands or straps), stick-on sensors, and the like, that may be positioned in other locations, such as bands around the head (e.g., a forehead headband), arm (e.g., a forearm band and/or bicep band), and/or leg (e.g., a thigh or calf band), behind the ear, under the armpit, and the like. Wearable devices 104 may also be attached to, or included in, articles of clothing. For example, wearable devices 104 may be included in pockets and/or pouches on clothing. As another example, wearable device 104 may be clipped and/or pinned to clothing, or may otherwise be maintained within the vicinity of the user 102. Example articles of clothing may include, but are not limited to, hats, shirts, gloves, pants, socks, outerwear (e.g., jackets), and undergarments. In some implementations, wearable devices 104 may be included with other types of devices such as training/sporting devices that are used during physical activity. For example, wearable devices 104 may be attached to, or included in, a bicycle, skis, a tennis racket, a golf club, and/or training weights.

Much of the present disclosure may be described in the context of a ring wearable device 104. Accordingly, the terms "ring 104," "wearable device 104," and like terms, may be used interchangeably, unless noted otherwise herein. However, the use of the term "ring 104" is not to be regarded as limiting, as it is contemplated herein that aspects of the present disclosure may be performed using other wearable devices (e.g., watch wearable devices, necklace wearable device, bracelet wearable devices, earring wearable devices, anklet wearable devices, and the like).

In some aspects, user devices 106 may include handheld mobile computing devices, such as smartphones and tablet computing devices. User devices 106 may also include personal computers, such as laptop and desktop computing devices. Other example user devices 106 may include server computing devices that may communicate with other electronic devices (e.g., via the Internet). In some implementations, computing devices may include medical devices, such as external wearable computing devices (e.g., Holter monitors). Medical devices may also include implantable medical devices, such as pacemakers and cardioverter defibrillators. Other example user devices 106 may include home computing devices, such as internet of things (IoT) devices (e.g., IoT devices), smart televisions, smart speakers, smart displays (e.g., video call displays), hubs (e.g., wireless communication hubs), security systems, smart appliances (e.g., thermostats and refrigerators), and fitness equipment.

Some electronic devices (e.g., wearable devices 104, user devices 106) may measure physiological parameters of respective users 102, such as photoplethysmography waveforms, continuous skin temperature, a pulse waveform, respiration rate, heart rate, heart rate variability (HRV), actigraphy, galvanic skin response, pulse oximetry, blood oxygen saturation (SpO2), blood sugar levels (e.g., glucose metrics), and/or other physiological parameters. Some electronic devices that measure physiological parameters may also perform some/all of the calculations described herein. Some electronic devices may not measure physiological parameters, but may perform some/all of the calculations described herein. For example, a ring (e.g., wearable device 104), mobile device application, or a server computing device may process received physiological data that was measured by other devices.

In some implementations, a user 102 may operate, or may be associated with, multiple electronic devices, some of which may measure physiological parameters and some of which may process the measured physiological parameters. In some implementations, a user 102 may have a ring (e.g., wearable device 104) that measures physiological parameters. The user 102 may also have, or be associated with, a user device 106 (e.g., mobile device, smartphone), where the wearable device 104 and the user device 106 are communicatively coupled to one another. In some cases, the user device 106 may receive data from the wearable device 104 and perform some/all of the calculations described herein. In some implementations, the user device 106 may also measure physiological parameters described herein, such as motion/activity parameters.

For example, as illustrated in FIG. 1, a first user 102-*a* (User 1) may operate, or may be associated with, a wearable device 104-*a* (e.g., ring 104-*a*) and a user device 106-*a* that may operate as described herein. In this example, the user device 106-*a* associated with user 102-*a* may process/store physiological parameters measured by the ring 104-*a*. Comparatively, a second user 102-*b* (User 2) may be associated with a ring 104-*b*, a watch wearable device 104-*c* (e.g., watch 104-*c*), and a user device 106-*b*, where the user device 106-*b* associated with user 102-*b* may process/store physiological parameters measured by the ring 104-*b* and/or the watch 104-*c*. Moreover, an nth user 102-*n* (User N) may be associated with an arrangement of electronic devices described herein (e.g., ring 104-*n*, user device 106-*n*). In some aspects, wearable devices 104 (e.g., rings 104, watches 104) and other electronic devices may be communicatively coupled to the user devices 106 of the respective users 102 via Bluetooth, Wi-Fi, and other wireless protocols. Moreover, in some cases, the wearable device 104 and the user device 106 may be included within (or make up) the same device. For example, in some cases, the wearable device 104 may be configured to execute an application associated with the wearable device 104, and may be configured to display data via a GUI.

In some implementations, the rings 104 (e.g., wearable devices 104) of the system 100 may be configured to collect physiological data from the respective users 102 based on arterial blood flow within the user's finger. In particular, a ring 104 may utilize one or more light-emitting components, such as LEDs (e.g., red LEDs, green LEDs) that emit light on the palm-side of a user's finger to collect physiological data based on arterial blood flow within the user's finger. In general, the terms light-emitting components, light-emitting elements, and like terms, may include, but are not limited to, LEDs, micro LEDs, mini LEDs, laser diodes (LDs) (e.g., vertical cavity surface-emitting lasers (VCSELs), and the like.

In some cases, the system 100 may be configured to collect physiological data from the respective users 102 based on blood flow diffused into a microvascular bed of skin with capillaries and arterioles. For example, the system 100 may collect PPG data based on a measured amount of blood diffused into the microvascular system of capillaries and arterioles. In some implementations, the ring 104 may acquire the physiological data using a combination of both green and red LEDs. The physiological data may include any physiological data known in the art including, but not limited to, temperature data, accelerometer data (e.g., movement/motion data), heart rate data, HRV data, blood oxygen level data, or any combination thereof.

The use of both green and red LEDs may provide several advantages over other solutions, as red and green LEDs have been found to have their own distinct advantages when acquiring physiological data under different conditions (e.g., light/dark, active/inactive) and via different parts of the body, and the like. For example, green LEDs have been found to exhibit better performance during exercise. Moreover, using multiple LEDs (e.g., green and red LEDs) distributed around the ring 104 has been found to exhibit superior performance as compared to wearable devices that utilize LEDs that are positioned close to one another, such as within a watch wearable device. Furthermore, the blood vessels in the finger (e.g., arteries, capillaries) are more accessible via LEDs as compared to blood vessels in the wrist. In particular, arteries in the wrist are positioned on the bottom of the wrist (e.g., palm-side of the wrist), meaning only capillaries are accessible on the top of the wrist (e.g., back of hand side of the wrist), where wearable watch devices and similar devices are typically worn. As such, utilizing LEDs and other sensors within a ring 104 has been found to exhibit superior performance as compared to wearable devices worn on the wrist, as the ring 104 may have greater access to arteries (as compared to capillaries), thereby resulting in stronger signals and more valuable physiological data.

The electronic devices of the system 100 (e.g., user devices 106, wearable devices 104) may be communicatively coupled to one or more servers 110 via wired or wireless communication protocols. For example, as shown in FIG. 1, the electronic devices (e.g., user devices 106) may be communicatively coupled to one or more servers 110 via a network 108. The network 108 may implement transfer control protocol and internet protocol (TCP/IP), such as the Internet, or may implement other network 108 protocols. Network connections between the network 108 and the respective electronic devices may facilitate transport of data via email, web, text messages, mail, or any other appropriate form of interaction within a computer network 108. For example, in some implementations, the ring 104-*a* associated with the first user 102-*a* may be communicatively coupled to the user device 106-*a*, where the user device 106-*a* is communicatively coupled to the servers 110 via the network 108. In additional or alternative cases, wearable devices 104 (e.g., rings 104, watches 104) may be directly communicatively coupled to the network 108.

The system 100 may offer an on-demand database service between the user devices 106 and the one or more servers 110. In some cases, the servers 110 may receive data from the user devices 106 via the network 108, and may store and analyze the data. Similarly, the servers 110 may provide data to the user devices 106 via the network 108. In some cases, the servers 110 may be located at one or more data centers. The servers 110 may be used for data storage, management, and processing. In some implementations, the servers 110 may provide a web-based interface to the user device 106 via web browsers.

In some aspects, the system 100 may detect periods of time that a user 102 is asleep, and classify periods of time that the user 102 is asleep into one or more sleep stages (e.g., sleep stage classification). For example, as shown in FIG. 1, User 102-*a* may be associated with a wearable device 104-*a* (e.g., ring 104-*a*) and a user device 106-*a*. In this example, the ring 104-*a* may collect physiological data associated with the user 102-*a*, including temperature, heart rate, HRV, respiratory rate, and the like. In some aspects, data collected by the ring 104-*a* may be input to a machine learning classifier, where the machine learning classifier is configured to determine periods of time that the user 102-*a* is (or was) asleep. Moreover, the machine learning classifier may be configured to classify periods of time into different sleep stages, including an awake sleep stage, a rapid eye movement (REM) sleep stage, a light sleep stage (non-REM (NREM)), and a deep sleep stage (NREM). In some aspects, the classified sleep stages may be displayed to the user 102-*a* via a GUI of the user device 106-*a*. Sleep stage classification may be used to provide feedback to a user 102-*a* regarding the user's sleeping patterns, such as recommended bedtimes, recommended wake-up times, and the like. Moreover, in some implementations, sleep stage classification techniques described herein may be used to calculate scores for the respective user, such as Sleep Scores, Readiness Scores, and the like.

In some aspects, the system 100 may utilize circadian rhythm-derived features to further improve physiological data collection, data processing procedures, and other techniques described herein. The term circadian rhythm may refer to a natural, internal process that regulates an individual's sleep-wake cycle, that repeats approximately every 24 hours. In this regard, techniques described herein may utilize circadian rhythm adjustment models to improve physiological data collection, analysis, and data processing. For example, a circadian rhythm adjustment model may be input into a machine learning classifier along with physiological data collected from the user 102-*a* via the wearable device 104-*a*. In this example, the circadian rhythm adjustment model may be configured to "weight," or adjust, physiological data collected throughout a user's natural, approximately 24-hour circadian rhythm. In some implementations, the system may initially start with a "baseline" circadian rhythm adjustment model, and may modify the baseline model using physiological data collected from each user 102 to generate tailored, individualized circadian rhythm adjustment models that are specific to each respective user 102.

In some aspects, the system 100 may utilize other biological rhythms to further improve physiological data collection, analysis, and processing by phase of these other rhythms. For example, if a weekly rhythm is detected within an individual's baseline data, then the model may be configured to adjust "weights" of data by day of the week. Biological rhythms that may require adjustment to the model by this method include: 1) ultradian (faster than a day rhythms, including sleep cycles in a sleep state, and oscillations from less than an hour to several hours periodicity in the measured physiological variables during wake state; 2) circadian rhythms; 3) non-endogenous daily rhythms shown to be imposed on top of circadian rhythms, as in work schedules; 4) weekly rhythms, or other artificial time periodicities exogenously imposed (e.g., in a hypothetical culture with 12 day "weeks," 12 day rhythms could be used); 5) multi-day ovarian rhythms in women and spermatogenesis rhythms in men; 6) lunar rhythms (relevant for individuals living with low or no artificial lights); and 7) seasonal rhythms.

The biological rhythms are not always stationary rhythms. For example, many women experience variability in ovarian cycle length across cycles, and ultradian rhythms are not expected to occur at exactly the same time or periodicity across days even within a user. As such, signal processing techniques sufficient to quantify the frequency composition while preserving temporal resolution of these rhythms in physiological data may be used to improve detection of these rhythms, to assign phase of each rhythm to each moment in time measured, and to thereby modify adjustment models and comparisons of time intervals. The biological rhythm-adjustment models and parameters can be added in linear or non-linear combinations as appropriate to more accurately capture the dynamic physiological baselines of an individual or group of individuals.

In some aspects, the rings 104 of the system 100 may support PCBs with wings on which one or more LEDs, one or more PDs, or both, may be positioned to create more direct (e.g., less arched) optical paths between the one or more LEDs and the one or more PDs (e.g., created desired optical paths between the one or more LEDs and the one or more PDs). For example, a ring 104, such as the ring 104-*a*, the ring 104-*b*, or both, may include an inner housing defining an inner circumference of the ring 104 and an outer housing defining an outer circumference of the ring 104. Additionally, the ring 104 may include a PCB that wraps (e.g., at least partially) around the inner circumference of the ring 104, where the PCB includes one or more wings on which one or more LEDs, one or more PDs, or both, are positioned. In such cases, a wing may be an extrusion (e.g., made of PCB) from the PCB, where the extrusion is at least partially at an angle to a top surface (e.g., top face) of the PCB (e.g., surface facing the inner housing).

Thus, an LED may be positioned on a first wing of the PCB and a PD may be positioned on a second wing of the PCB, opposite the first wing, where a first angle of the first wing and a second angle of the second wing cause the first and second wings to angle towards each other. Thus, an arch (e.g., depth) of an optical path between the LED and the PD may be based on the first angle, the second angle or both. In other words, optical path may be set to a desired optical path during manufacturing based on selection of the first angle, the second angle, or both, such that, in some cases, the LED-PD pair may be associated with an optical path that intersects one or more anatomical structures, such as pulsating blood vessels (e.g., for heart rate and blood pressure measurements), or, in some other cases, may be associated with an optical path that does not intersect one or more anatomical structures, such as the pulsating blood vessels (e.g., for blood oxygen saturation measurements), bone (e.g., to avoid reflections), tendons (e.g., to avoid movement noise), or any combination thereof. Additionally, or alternatively, a PD and an LED positioned within the threshold proximity of each other may further be positioned on wings and the wings may be set at selected angles to avoid interference between the PDs and the LED.

It should be appreciated by a person skilled in the art that one or more aspects of the disclosure may be implemented in a system 100 to additionally or alternatively solve other problems than those described above. Furthermore, aspects of the disclosure may provide technical improvements to "conventional" systems or processes as described herein. However, the description and appended drawings only include example technical improvements resulting from implementing aspects of the disclosure, and accordingly do not represent all of the technical improvements provided within the scope of the claims.

Figure 2:
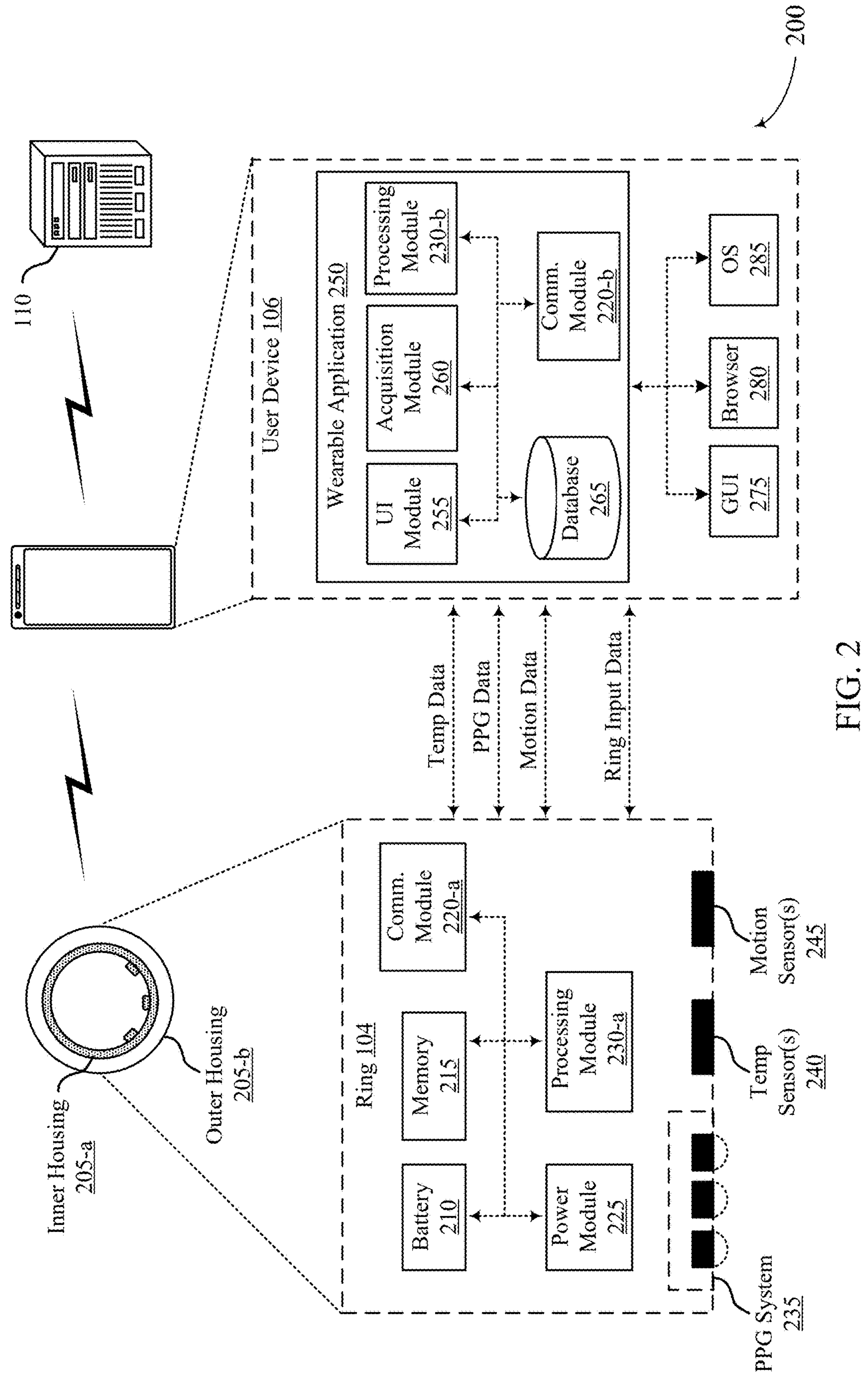
FIG. 2 illustrates an example of a system that supports techniques for adjusting optical paths via angling of optoelectronic components in accordance with aspects of the present disclosure.

FIG. 2 illustrates an example of a system 200 that supports techniques for adjusting optical paths via angling of optoelectronic components in accordance with aspects of the present disclosure. The system 200 may implement, or be implemented by, system 100. In particular, system 200 illustrates an example of a ring 104 (e.g., wearable device 104), a user device 106, and a server 110, as described with reference to FIG. 1.

In some aspects, the ring 104 may be configured to be worn around a user's finger, and may determine one or more user physiological parameters when worn around the user's finger. Example measurements and determinations may include, but are not limited to, user skin temperature, pulse waveforms, respiratory rate, heart rate, HRV, blood oxygen levels (SpO2), blood sugar levels (e.g., glucose metrics), and the like.

The system 200 further includes a user device 106 (e.g., a smartphone) in communication with the ring 104. For example, the ring 104 may be in wireless and/or wired communication with the user device 106. In some implementations, the ring 104 may send measured and processed data (e.g., temperature data, photoplethysmogram (PPG) data, motion/accelerometer data, ring input data, and the like) to the user device 106. The user device 106 may also send data to the ring 104, such as ring 104 firmware/configuration updates. The user device 106 may process data. In some implementations, the user device 106 may transmit data to the server 110 for processing and/or storage.

The ring 104 may include a housing 205 that may include an inner housing 205-*a* and an outer housing 205-*b*. In some aspects, the housing 205 of the ring 104 may store or otherwise include various components of the ring including, but not limited to, device electronics, a power source (e.g., battery 210, and/or capacitor), one or more substrates (e.g., printable circuit boards) that interconnect the device electronics and/or power source, and the like. The device electronics may include device modules (e.g., hardware/software), such as: a processing module 230-*a*, a memory 215, a communication module 220-*a*, a power module 225, and the like. The device electronics may also include one or more sensors. Example sensors may include one or more temperature sensors 240, a PPG sensor assembly (e.g., PPG system 235), and one or more motion sensors 245.

The sensors may include associated modules (not illustrated) configured to communicate with the respective components/modules of the ring 104, and generate signals associated with the respective sensors. In some aspects, each of the components/modules of the ring 104 may be communicatively coupled to one another via wired or wireless connections. Moreover, the ring 104 may include additional and/or alternative sensors or other components that are configured to collect physiological data from the user, including light sensors (e.g., LEDs), oximeters, and the like.

The ring 104 shown and described with reference to FIG. 2 is provided solely for illustrative purposes. As such, the ring 104 may include additional or alternative components as those illustrated in FIG. 2. Other rings 104 that provide functionality described herein may be fabricated. For example, rings 104 with fewer components (e.g., sensors) may be fabricated. In a specific example, a ring 104 with a single temperature sensor 240 (or other sensor), a power source, and device electronics configured to read the single temperature sensor 240 (or other sensor) may be fabricated. In another specific example, a temperature sensor 240 (or other sensor) may be attached to a user's finger (e.g., using adhesives, wraps, clamps, spring loaded clamps, etc.). In this case, the sensor may be wired to another computing device, such as a wrist worn computing device that reads the temperature sensor 240 (or other sensor). In other examples, a ring 104 that includes additional sensors and processing functionality may be fabricated.

The housing 205 may include one or more housing 205 components. The housing 205 may include an outer housing 205-*b* component (e.g., a shell) and an inner housing 205-*a* component (e.g., a molding). The housing 205 may include additional components (e.g., additional layers) not explicitly illustrated in FIG. 2. For example, in some implementations, the ring 104 may include one or more insulating layers that electrically insulate the device electronics and other conductive materials (e.g., electrical traces) from the outer housing 205-*b* (e.g., a metal outer housing 205-*b*). The housing 205 may provide structural support for the device electronics, battery 210, substrate(s), and other components. For example, the housing 205 may protect the device electronics, battery 210, and substrate(s) from mechanical forces, such as pressure and impacts. The housing 205 may also protect the device electronics, battery 210, and substrate (s) from water and/or other chemicals.

The outer housing 205-*b* may be fabricated from one or more materials. In some implementations, the outer housing 205-*b* may include a metal, such as titanium, that may provide strength and abrasion resistance at a relatively light weight. The outer housing 205-*b* may also be fabricated from other materials, such polymers. In some implementations, the outer housing 205-*b* may be protective as well as decorative.

The inner housing 205-*a* may be configured to interface with the user's finger. The inner housing 205-*a* may be formed from a polymer (e.g., a medical grade polymer) or other material. In some implementations, the inner housing 205-*a* may be transparent. For example, the inner housing 205-*a* may be transparent to light emitted by the PPG light emitting diodes (LEDs). In some implementations, the inner housing 205-*a* component may be molded onto the outer housing 205-*b*. For example, the inner housing 205-*a* may include a polymer that is molded (e.g., injection molded) to fit into an outer housing 205-*b* metallic shell.

The ring 104 may include one or more substrates (not illustrated). The device electronics and battery 210 may be included on the one or more substrates. For example, the device electronics and battery 210 may be mounted on one or more substrates. Example substrates may include one or more printed circuit boards (PCBs), such as flexible PCB (e.g., polyimide). In some implementations, the electronics/battery 210 may include surface mounted devices (e.g., surface-mount technology (SMT) devices) on a flexible PCB. In some implementations, the one or more substrates (e.g., one or more flexible PCBs) may include electrical traces that provide electrical communication between device electronics. The electrical traces may also connect the battery 210 to the device electronics.

The device electronics, battery 210, and substrates may be arranged in the ring 104 in a variety of ways. In some implementations, one substrate that includes device electronics may be mounted along the bottom of the ring 104 (e.g., the bottom half), such that the sensors (e.g., PPG system 235, temperature sensors 240, motion sensors 245, and other sensors) interface with the underside of the user's finger. In these implementations, the battery 210 may be included along the top portion of the ring 104 (e.g., on another substrate).

The various components/modules of the ring 104 represent functionality (e.g., circuits and other components) that may be included in the ring 104. Modules may include any discrete and/or integrated electronic circuit components that implement analog and/or digital circuits capable of producing the functions attributed to the modules herein. For example, the modules may include analog circuits (e.g., amplification circuits, filtering circuits, analog/digital conversion circuits, and/or other signal conditioning circuits). The modules may also include digital circuits (e.g., combinational or sequential logic circuits, memory circuits etc.).

The memory 215 (memory module) of the ring 104 may include any volatile, non-volatile, magnetic, or electrical media, such as a random access memory (RAM), read-only memory (ROM), non-volatile RAM (NVRAM), electrically-erasable programmable ROM (EEPROM), flash memory, or any other memory device. The memory 215 may store any of the data described herein. For example, the memory 215 may be configured to store data (e.g., motion data, temperature data, PPG data) collected by the respective sensors and PPG system 235. Furthermore, memory 215 may include instructions that, when executed by one or more processing circuits, cause the modules to perform various functions attributed to the modules herein. The device electronics of the ring 104 described herein are only example device electronics. As such, the types of electronic components used to implement the device electronics may vary based on design considerations.

The functions attributed to the modules of the ring 104 described herein may be embodied as one or more processors, hardware, firmware, software, or any combination thereof. Depiction of different features as modules is intended to highlight different functional aspects and does not necessarily imply that such modules must be realized by separate hardware/software components. Rather, functionality associated with one or more modules may be performed by separate hardware/software components or integrated within common hardware/software components.

The processing module 230-*a* of the ring 104 may include one or more processors (e.g., processing units), microcontrollers, digital signal processors, systems on a chip (SOCs), and/or other processing devices. The processing module 230-*a* communicates with the modules included in the ring 104. For example, the processing module 230-*a* may transmit/receive data to/from the modules and other components of the ring 104, such as the sensors. As described herein, the modules may be implemented by various circuit components. Accordingly, the modules may also be referred to as circuits (e.g., a communication circuit and power circuit).

The processing module 230-*a* may communicate with the memory 215. The memory 215 may include computer-readable instructions that, when executed by the processing module 230-*a*, cause the processing module 230-*a* to perform the various functions attributed to the processing module 230-*a* herein. In some implementations, the processing module 230-*a* (e.g., a microcontroller) may include additional features associated with other modules, such as communication functionality provided by the communication module 220-*a* (e.g., an integrated Bluetooth Low Energy transceiver) and/or additional onboard memory 215.

The communication module 220-*a* may include circuits that provide wireless and/or wired communication with the user device 106 (e.g., communication module 220-*b* of the user device 106). In some implementations, the communication modules 220-*a*, 220-*b* may include wireless communication circuits, such as Bluetooth circuits and/or Wi-Fi circuits. In some implementations, the communication modules 220-*a*, 220-*b* can include wired communication circuits, such as Universal Serial Bus (USB) communication circuits. Using the communication module 220-*a*, the ring 104 and the user device 106 may be configured to communicate with each other. The processing module 230-*a* of the ring may be configured to transmit/receive data to/from the user device 106 via the communication module 220-*a*. Example data may include, but is not limited to, motion data, temperature data, pulse waveforms, heart rate data, HRV data, PPG data, and status updates (e.g., charging status, battery charge level, and/or ring 104 configuration settings). The processing module 230-*a* of the ring may also be configured to receive updates (e.g., software/firmware updates) and data from the user device 106.

The ring 104 may include a battery 210 (e.g., a rechargeable battery 210). An example battery 210 may include a Lithium-Ion or Lithium-Polymer type battery 210, although a variety of battery 210 options are possible. The battery 210 may be wirelessly charged. In some implementations, the ring 104 may include a power source other than the battery 210, such as a capacitor. The power source (e.g., battery 210 or capacitor) may have a curved geometry that matches the curve of the ring 104. In some aspects, a charger or other power source may include additional sensors that may be used to collect data in addition to, or that supplements, data collected by the ring 104 itself. Moreover, a charger or other power source for the ring 104 may function as a user device 106, in which case the charger or other power source for the ring 104 may be configured to receive data from the ring 104, store and/or process data received from the ring 104, and communicate data between the ring 104 and the servers 110.

In some aspects, the ring 104 includes a power module 225 that may control charging of the battery 210. For example, the power module 225 may interface with an external wireless charger that charges the battery 210 when interfaced with the ring 104. The charger may include a datum structure that mates with a ring 104 datum structure to create a specified orientation with the ring 104 during charging. The power module 225 may also regulate voltage(s) of the device electronics, regulate power output to the device electronics, and monitor the state of charge of the battery 210. In some implementations, the battery 210 may include a protection circuit module (PCM) that protects the battery 210 from high current discharge, over voltage during charging, and under voltage during discharge. The power module 225 may also include electro-static discharge (ESD) protection.

The one or more temperature sensors 240 may be electrically coupled to the processing module 230-*a*. The temperature sensor 240 may be configured to generate a temperature signal (e.g., temperature data) that indicates a temperature read or sensed by the temperature sensor 240. The processing module 230-*a* may determine a temperature of the user in the location of the temperature sensor 240. For example, in the ring 104, temperature data generated by the temperature sensor 240 may indicate a temperature of a user at the user's finger (e.g., skin temperature). In some implementations, the temperature sensor 240 may contact the user's skin. In other implementations, a portion of the housing 205 (e.g., the inner housing 205-*a*) may form a barrier (e.g., a thin, thermally conductive barrier) between the temperature sensor 240 and the user's skin. In some implementations, portions of the ring 104 configured to contact the user's finger may have thermally conductive portions and thermally insulative portions. The thermally conductive portions may conduct heat from the user's finger to the temperature sensors 240. The thermally insulative portions may insulate portions of the ring 104 (e.g., the temperature sensor 240) from ambient temperature.

In some implementations, the temperature sensor 240 may generate a digital signal (e.g., temperature data) that the processing module 230-*a* may use to determine the temperature. As another example, in cases where the temperature sensor 240 includes a passive sensor, the processing module 230-*a* (or a temperature sensor 240 module) may measure a current/voltage generated by the temperature sensor 240 and determine the temperature based on the measured current/voltage. Example temperature sensors 240 may include a thermistor, such as a negative temperature coefficient (NTC) thermistor, or other types of sensors including resistors, transistors, diodes, and/or other electrical/electronic components.

The processing module 230-*a* may sample the user's temperature over time. For example, the processing module 230-*a* may sample the user's temperature according to a sampling rate. An example sampling rate may include one sample per second, although the processing module 230-*a* may be configured to sample the temperature signal at other sampling rates that are higher or lower than one sample per second. In some implementations, the processing module 230-*a* may sample the user's temperature continuously throughout the day and night. Sampling at a sufficient rate (e.g., one sample per second) throughout the day may provide sufficient temperature data for analysis described herein.

The processing module 230-*a* may store the sampled temperature data in memory 215. In some implementations, the processing module 230-*a* may process the sampled temperature data. For example, the processing module 230-*a* may determine average temperature values over a period of time. In one example, the processing module 230-*a* may determine an average temperature value each minute by summing all temperature values collected over the minute and dividing by the number of samples over the minute. In a specific example where the temperature is sampled at one sample per second, the average temperature may be a sum of all sampled temperatures for one minute divided by sixty seconds. The memory 215 may store the average temperature values over time. In some implementations, the memory 215 may store average temperatures (e.g., one per minute) instead of sampled temperatures in order to conserve memory 215.

The sampling rate, which may be stored in memory 215, may be configurable. In some implementations, the sampling rate may be the same throughout the day and night. In other implementations, the sampling rate may be changed throughout the day/night. In some implementations, the ring 104 may filter/reject temperature readings, such as large spikes in temperature that are not indicative of physiological changes (e.g., a temperature spike from a hot shower). In some implementations, the ring 104 may filter/reject temperature readings that may not be reliable due to other factors, such as excessive motion during exercise (e.g., as indicated by a motion sensor 245).

The ring 104 (e.g., communication module) may transmit the sampled and/or average temperature data to the user device 106 for storage and/or further processing. The user device 106 may transfer the sampled and/or average temperature data to the server 110 for storage and/or further processing.

Although the ring 104 is illustrated as including a single temperature sensor 240, the ring 104 may include multiple temperature sensors 240 in one or more locations, such as arranged along the inner housing 205-*a* near the user's finger. In some implementations, the temperature sensors 240 may be stand-alone temperature sensors 240. Additionally, or alternatively, one or more temperature sensors 240 may be included with other components (e.g., packaged with other components), such as with the accelerometer and/or processor.

The processing module 230-*a* may acquire and process data from multiple temperature sensors 240 in a similar manner described with respect to a single temperature sensor 240. For example, the processing module 230 may individually sample, average, and store temperature data from each of the multiple temperature sensors 240. In other examples, the processing module 230-*a* may sample the sensors at different rates and average/store different values for the different sensors. In some implementations, the processing module 230-*a* may be configured to determine a single temperature based on the average of two or more temperatures determined by two or more temperature sensors 240 in different locations on the finger.

The temperature sensors 240 on the ring 104 may acquire distal temperatures at the user's finger (e.g., any finger). For example, one or more temperature sensors 240 on the ring 104 may acquire a user's temperature from the underside of a finger or at a different location on the finger. In some implementations, the ring 104 may continuously acquire distal temperature (e.g., at a sampling rate). Although distal temperature measured by a ring 104 at the finger is described herein, other devices may measure temperature at the same/different locations. In some cases, the distal temperature measured at a user's finger may differ from the temperature measured at a user's wrist or other external body location. Additionally, the distal temperature measured at a user's finger (e.g., a "shell" temperature) may differ from the user's core temperature. As such, the ring 104 may provide a useful temperature signal that may not be acquired at other internal/external locations of the body. In some cases, continuous temperature measurement at the finger may capture temperature fluctuations (e.g., small or large fluctuations) that may not be evident in core temperature. For example, continuous temperature measurement at the finger may capture minute-to-minute or hour-to-hour temperature fluctuations that provide additional insight that may not be provided by other temperature measurements elsewhere in the body.

The ring 104 may include a PPG system 235. The PPG system 235 may include one or more optical transmitters that transmit light. The PPG system 235 may also include one or more optical receivers that receive light transmitted by the one or more optical transmitters. An optical receiver may generate a signal (hereinafter "PPG" signal) that indicates an amount of light received by the optical receiver. The optical transmitters may illuminate a region of the user's finger. The PPG signal generated by the PPG system 235 may indicate the perfusion of blood in the illuminated region. For example, the PPG signal may indicate blood volume changes in the illuminated region caused by a user's pulse pressure. The processing module 230-*a* may sample the PPG signal and determine a user's pulse waveform based on the PPG signal. The processing module 230-*a* may determine a variety of physiological parameters based on the user's pulse waveform, such as a user's respiratory rate, heart rate, HRV, oxygen saturation, and other circulatory parameters.

In some implementations, the PPG system 235 may be configured as a reflective PPG system 235 where the optical receiver(s) receive transmitted light that is reflected through the region of the user's finger. In some implementations, the PPG system 235 may be configured as a transmissive PPG system 235 where the optical transmitter(s) and optical receiver(s) are arranged opposite to one another, such that light is transmitted directly through a portion of the user's finger to the optical receiver(s).

The number and ratio of transmitters and receivers included in the PPG system 235 may vary. Example optical transmitters may include light-emitting diodes (LEDs). The optical transmitters may transmit light in the infrared spectrum and/or other spectrums. Example optical receivers may include, but are not limited to, photosensors, phototransistors, and photodiodes. The optical receivers may be configured to generate PPG signals in response to the wavelengths received from the optical transmitters. The location of the transmitters and receivers may vary. Additionally, a single device may include reflective and/or transmissive PPG systems 235.

The PPG system 235 illustrated in FIG. 2 may include a reflective PPG system 235 in some implementations. In these implementations, the PPG system 235 may include a centrally located optical receiver (e.g., at the bottom of the ring 104) and two optical transmitters located on each side of the optical receiver. In this implementation, the PPG system 235 (e.g., optical receiver) may generate the PPG signal based on light received from one or both of the optical transmitters. In other implementations, other placements, combinations, and/or configurations of one or more optical transmitters and/or optical receivers are contemplated.

The processing module 230-*a* may control one or both of the optical transmitters to transmit light while sampling the PPG signal generated by the optical receiver. In some implementations, the processing module 230-*a* may cause the optical transmitter with the stronger received signal to transmit light while sampling the PPG signal generated by the optical receiver. For example, the selected optical transmitter may continuously emit light while the PPG signal is sampled at a sampling rate (e.g., 250 Hz).

Sampling the PPG signal generated by the PPG system 235 may result in a pulse waveform that may be referred to as a "PPG." The pulse waveform may indicate blood pressure vs time for multiple cardiac cycles. The pulse waveform may include peaks that indicate cardiac cycles. Additionally, the pulse waveform may include respiratory induced variations that may be used to determine respiration rate. The processing module 230-*a* may store the pulse waveform in memory 215 in some implementations. The processing module 230-*a* may process the pulse waveform as it is generated and/or from memory 215 to determine user physiological parameters described herein.

The processing module 230-*a* may determine the user's heart rate based on the pulse waveform. For example, the processing module 230-*a* may determine heart rate (e.g., in beats per minute) based on the time between peaks in the pulse waveform. The time between peaks may be referred to as an interbeat interval (IBI). The processing module 230-*a* may store the determined heart rate values and IBI values in memory 215.

The processing module 230-*a* may determine HRV over time. For example, the processing module 230-*a* may determine HRV based on the variation in the IBIs. The processing module 230-*a* may store the HRV values over time in the memory 215. Moreover, the processing module 230-*a* may determine the user's respiratory rate over time. For example, the processing module 230-*a* may determine respiratory rate based on frequency modulation, amplitude modulation, or baseline modulation of the user's IBI values over a period of time. Respiratory rate may be calculated in breaths per minute or as another breathing rate (e.g., breaths per 30 seconds). The processing module 230-*a* may store user respiratory rate values over time in the memory 215.

The ring 104 may include one or more motion sensors 245, such as one or more accelerometers (e.g., 6-D accelerometers) and/or one or more gyroscopes (gyros). The motion sensors 245 may generate motion signals that indicate motion of the sensors. For example, the ring 104 may include one or more accelerometers that generate acceleration signals that indicate acceleration of the accelerometers. As another example, the ring 104 may include one or more gyro sensors that generate gyro signals that indicate angular motion (e.g., angular velocity) and/or changes in orientation. The motion sensors 245 may be included in one or more sensor packages. An example accelerometer/gyro sensor is a Bosch BM1160 inertial micro electro-mechanical system (MEMS) sensor that may measure angular rates and accelerations in three perpendicular axes.

The processing module 230-*a* may sample the motion signals at a sampling rate (e.g., 50 Hz) and determine the motion of the ring 104 based on the sampled motion signals. For example, the processing module 230-*a* may sample acceleration signals to determine acceleration of the ring 104. As another example, the processing module 230-*a* may sample a gyro signal to determine angular motion. In some implementations, the processing module 230-*a* may store motion data in memory 215. Motion data may include sampled motion data as well as motion data that is calculated based on the sampled motion signals (e.g., acceleration and angular values).

The ring 104 may store a variety of data described herein. For example, the ring 104 may store temperature data, such as raw sampled temperature data and calculated temperature data (e.g., average temperatures). As another example, the ring 104 may store PPG signal data, such as pulse waveforms and data calculated based on the pulse waveforms (e.g., heart rate values, IBI values, HRV values, and respiratory rate values). The ring 104 may also store motion data, such as sampled motion data that indicates linear and angular motion.

The ring 104, or other computing device, may calculate and store additional values based on the sampled/calculated physiological data. For example, the processing module 230 may calculate and store various metrics, such as sleep metrics (e.g., a Sleep Score), activity metrics, and readiness metrics. In some implementations, additional values/metrics may be referred to as "derived values." The ring 104, or other computing/wearable device, may calculate a variety of values/metrics with respect to motion. Example derived values for motion data may include, but are not limited to, motion count values, regularity values, intensity values, metabolic equivalence of task values (METs), and orientation values. Motion counts, regularity values, intensity values, and METs may indicate an amount of user motion (e.g., velocity/acceleration) over time. Orientation values may indicate how the ring 104 is oriented on the user's finger and if the ring 104 is worn on the left hand or right hand.

In some implementations, motion counts and regularity values may be determined by counting a number of acceleration peaks within one or more periods of time (e.g., one or more 30 second to 1 minute periods). Intensity values may indicate a number of movements and the associated intensity (e.g., acceleration values) of the movements. The intensity values may be categorized as low, medium, and high, depending on associated threshold acceleration values. METs may be determined based on the intensity of movements during a period of time (e.g., 30 seconds), the regularity/irregularity of the movements, and the number of movements associated with the different intensities.

In some implementations, the processing module 230-*a* may compress the data stored in memory 215. For example, the processing module 230-*a* may delete sampled data after making calculations based on the sampled data. As another example, the processing module 230-*a* may average data over longer periods of time in order to reduce the number of stored values. In a specific example, if average temperatures for a user over one minute are stored in memory 215, the processing module 230-*a* may calculate average temperatures over a five minute time period for storage, and then subsequently erase the one minute average temperature data. The processing module 230-*a* may compress data based on a variety of factors, such as the total amount of used/available memory 215 and/or an elapsed time since the ring 104 last transmitted the data to the user device 106.

Although a user's physiological parameters may be measured by sensors included on a ring 104, other devices may measure a user's physiological parameters. For example, although a user's temperature may be measured by a temperature sensor 240 included in a ring 104, other devices may measure a user's temperature. In some examples, other wearable devices (e.g., wrist devices) may include sensors that measure user physiological parameters. Additionally, medical devices, such as external medical devices (e.g., wearable medical devices) and/or implantable medical devices, may measure a user's physiological parameters. One or more sensors on any type of computing device may be used to implement the techniques described herein.

The physiological measurements may be taken continuously throughout the day and/or night. In some implementations, the physiological measurements may be taken during portions of the day and/or portions of the night. In some implementations, the physiological measurements may be taken in response to determining that the user is in a specific state, such as an active state, resting state, and/or a sleeping state. For example, the ring 104 can make physiological measurements in a resting/sleep state in order to acquire cleaner physiological signals. In one example, the ring 104 or other device/system may detect when a user is resting and/or sleeping and acquire physiological parameters (e.g., temperature) for that detected state. The devices/systems may use the resting/sleep physiological data and/or other data when the user is in other states in order to implement the techniques of the present disclosure.

In some implementations, as described previously herein, the ring 104 may be configured to collect, store, and/or process data, and may transfer any of the data described herein to the user device 106 for storage and/or processing. In some aspects, the user device 106 includes a wearable application 250, an operating system (OS) 285, a web browser application (e.g., web browser 280), one or more additional applications, and a GUI 275. The user device 106 may further include other modules and components, including sensors, audio devices, haptic feedback devices, and the like. The wearable application 250 may include an example of an application (e.g., "app") that may be installed on the user device 106. The wearable application 250 may be configured to acquire data from the ring 104, store the acquired data, and process the acquired data as described herein. For example, the wearable application 250 may include a user interface (UI) module 255, an acquisition module 260, a processing module 230-*b*, a communication module 220-*b*, and a storage module (e.g., database 265) configured to store application data.

In some cases, the wearable device 104 and the user device 106 may be included within (or make up) the same device. For example, in some cases, the wearable device 104 may be configured to execute the wearable application 250, and may be configured to display data via the GUI 275.

The various data processing operations described herein may be performed by the ring 104, the user device 106, the servers 110, or any combination thereof. For example, in some cases, data collected by the ring 104 may be pre-processed and transmitted to the user device 106. In this example, the user device 106 may perform some data processing operations on the received data, may transmit the data to the servers 110 for data processing, or both. For instance, in some cases, the user device 106 may perform processing operations that require relatively low processing power and/or operations that require a relatively low latency, whereas the user device 106 may transmit the data to the servers 110 for processing operations that require relatively high processing power and/or operations that may allow relatively higher latency.

In some aspects, the ring 104, user device 106, and server 110 of the system 200 may be configured to evaluate sleep patterns for a user. In particular, the respective components of the system 200 may be used to collect data from a user via the ring 104, and generate one or more scores (e.g., Sleep Score, Readiness Score) for the user based on the collected data. For example, as noted previously herein, the ring 104 of the system 200 may be worn by a user to collect data from the user, including temperature, heart rate, HRV, and the like. Data collected by the ring 104 may be used to determine when the user is asleep in order to evaluate the user's sleep for a given "sleep day." In some aspects, scores may be calculated for the user for each respective sleep day, such that a first sleep day is associated with a first set of scores, and a second sleep day is associated with a second set of scores. Scores may be calculated for each respective sleep day based on data collected by the ring 104 during the respective sleep day. Scores may include, but are not limited to, Sleep Scores, Readiness Scores, and the like.

In some cases, "sleep days" may align with the traditional calendar days, such that a given sleep day runs from midnight to midnight of the respective calendar day. In other cases, sleep days may be offset relative to calendar days. For example, sleep days may run from 6:00 pm (18:00) of a calendar day until 6:00 pm (18:00) of the subsequent calendar day. In this example, 6:00 pm may serve as a "cut-off time," where data collected from the user before 6:00 pm is counted for the current sleep day, and data collected from the user after 6:00 pm is counted for the subsequent sleep day. Due to the fact that most individuals sleep the most at night, offsetting sleep days relative to calendar days may enable the system 200 to evaluate sleep patterns for users in such a manner that is consistent with their sleep schedules. In some cases, users may be able to selectively adjust (e.g., via the GUI) a timing of sleep days relative to calendar days so that the sleep days are aligned with the duration of time that the respective users typically sleep.

In some implementations, each overall score for a user for each respective day (e.g., Sleep Score, Readiness Score) may be determined/calculated based on one or more "contributors," "factors," or "contributing factors." For example, a user's overall Sleep Score may be calculated based on a set of contributors, including: total sleep, efficiency, restfulness, REM sleep, deep sleep, latency, timing, or any combination thereof. The Sleep Score may include any quantity of contributors. The "total sleep" contributor may refer to the sum of all sleep periods of the sleep day. The "efficiency" contributor may reflect the percentage of time spent asleep compared to time spent awake while in bed, and may be calculated using the efficiency average of long sleep periods (e.g., primary sleep period) of the sleep day, weighted by a duration of each sleep period. The "restfulness" contributor may indicate how restful the user's sleep is, and may be calculated using the average of all sleep periods of the sleep day, weighted by a duration of each period. The restfulness contributor may be based on a "wake up count" (e.g., sum of all the wake-ups (when user wakes up) detected during different sleep periods), excessive movement, and a "got up count" (e.g., sum of all the got-ups (when user gets out of bed) detected during the different sleep periods).

The "REM sleep" contributor may refer to a sum total of REM sleep durations across all sleep periods of the sleep day including REM sleep. Similarly, the "deep sleep" contributor may refer to a sum total of deep sleep durations across all sleep periods of the sleep day including deep sleep. The "latency" contributor may signify how long (e.g., average, median, longest) the user takes to go to sleep, and may be calculated using the average of long sleep periods throughout the sleep day, weighted by a duration of each period and the number of such periods (e.g., consolidation of a given sleep stage or sleep stages may be its own contributor or weight other contributors). Lastly, the "timing" contributor may refer to a relative timing of sleep periods within the sleep day and/or calendar day, and may be calculated using the average of all sleep periods of the sleep day, weighted by a duration of each period.

By way of another example, a user's overall Readiness Score may be calculated based on a set of contributors, including: sleep, sleep balance, heart rate, HRV balance, recovery index, temperature, activity, activity balance, or any combination thereof. The Readiness Score may include any quantity of contributors. The "sleep" contributor may refer to the combined Sleep Score of all sleep periods within the sleep day. The "sleep balance" contributor may refer to a cumulative duration of all sleep periods within the sleep day. In particular, sleep balance may indicate to a user whether the sleep that the user has been getting over some duration of time (e.g., the past two weeks) is in balance with the user's needs. Typically, adults need 7-9 hours of sleep a night to stay healthy, alert, and to perform at their best both mentally and physically. However, it is normal to have an occasional night of bad sleep, so the sleep balance contributor takes into account long-term sleep patterns to determine whether each user's sleep needs are being met. The "resting heart rate" contributor may indicate a lowest heart rate from the longest sleep period of the sleep day (e.g., primary sleep period) and/or the lowest heart rate from naps occurring after the primary sleep period.

Continuing with reference to the "contributors" (e.g., factors, contributing factors) of the Readiness Score, the "HRV balance" contributor may indicate a highest HRV average from the primary sleep period and the naps happening after the primary sleep period. The HRV balance contributor may help users keep track of their recovery status by comparing their HRV trend over a first time period (e.g., two weeks) to an average HRV over some second, longer time period (e.g., three months). The "recovery index" contributor may be calculated based on the longest sleep period. Recovery index measures how long it takes for a user's resting heart rate to stabilize during the night. A sign of a very good recovery is that the user's resting heart rate stabilizes during the first half of the night, at least six hours before the user wakes up, leaving the body time to recover for the next day. The "body temperature" contributor may be calculated based on the longest sleep period (e.g., primary sleep period) or based on a nap happening after the longest sleep period if the user's highest temperature during the nap is at least 0.5° C. higher than the highest temperature during the longest period. In some aspects, the ring may measure a user's body temperature while the user is asleep, and the system 200 may display the user's average temperature relative to the user's baseline temperature. If a user's body temperature is outside of their normal range (e.g., clearly above or below 0.0), the body temperature contributor may be highlighted (e.g., go to a "Pay attention" state) or otherwise generate an alert for the user.

In some aspects, the ring 104 of the system 200 may support PCBs with wings on which one or more LEDs, one or more PDs, or both, may be positioned to create more direct (e.g., less arched) optical paths between the one or more LEDs and the one or more PDs (e.g., create desired optical paths between the one or more LEDs and the one or more PDs). For example, as described previously, the ring 104 may include the inner housing 205-*a* defining an inner circumference of the ring 104 and may include the outer housing 205-*b* defining an outer circumference of the ring 104. Additionally, the ring 104 may include a PCB that wraps (e.g., at least partially) around the inner circumference of the ring 104, where the PCB includes one or more wings on which one or more LEDs, one or more PDs, or both, of the PPG system 235, are positioned. In such cases, a wing may be an extrusion (e.g., made of PCB) from the PCB, where the extrusion is at least partially at an angle to a top surface (e.g., top face) of the PCB (e.g., surface facing the inner housing 205-*a*).

Thus, an LED of the PPG system 235 may be positioned on a first wing of the PCB and a PD of the PPG system 235 may be positioned on a second wing of the PCB, opposite the first wing, where a first angle of the first wing and a second angle of the second wing cause the first and second wings to angle towards each other. Thus, an arch (e.g., depth) of an optical path between the LED and the PD (e.g., an LED-PD pair) may be based on the first angle, the second angle or both. In other words, optical path may be set to a desired optical path during manufacturing based on selection of the first angle, the second angle, or both, such that the LED-PD pair of the PPG system 235 may be associated with an optical path that intersect pulsating blood vessels (e.g., for heart rate and blood pressure measurements) or may be associated with an optical path that do not intersect pulsating blood vessels (e.g., for blood oxygen saturation measurements). Additionally, or alternatively, a PD and an LED positioned within the threshold proximity of each other may further be positioned on wings and the wings may be set at selected angles to avoid interference between the PDs and the LED.

Figure 3:
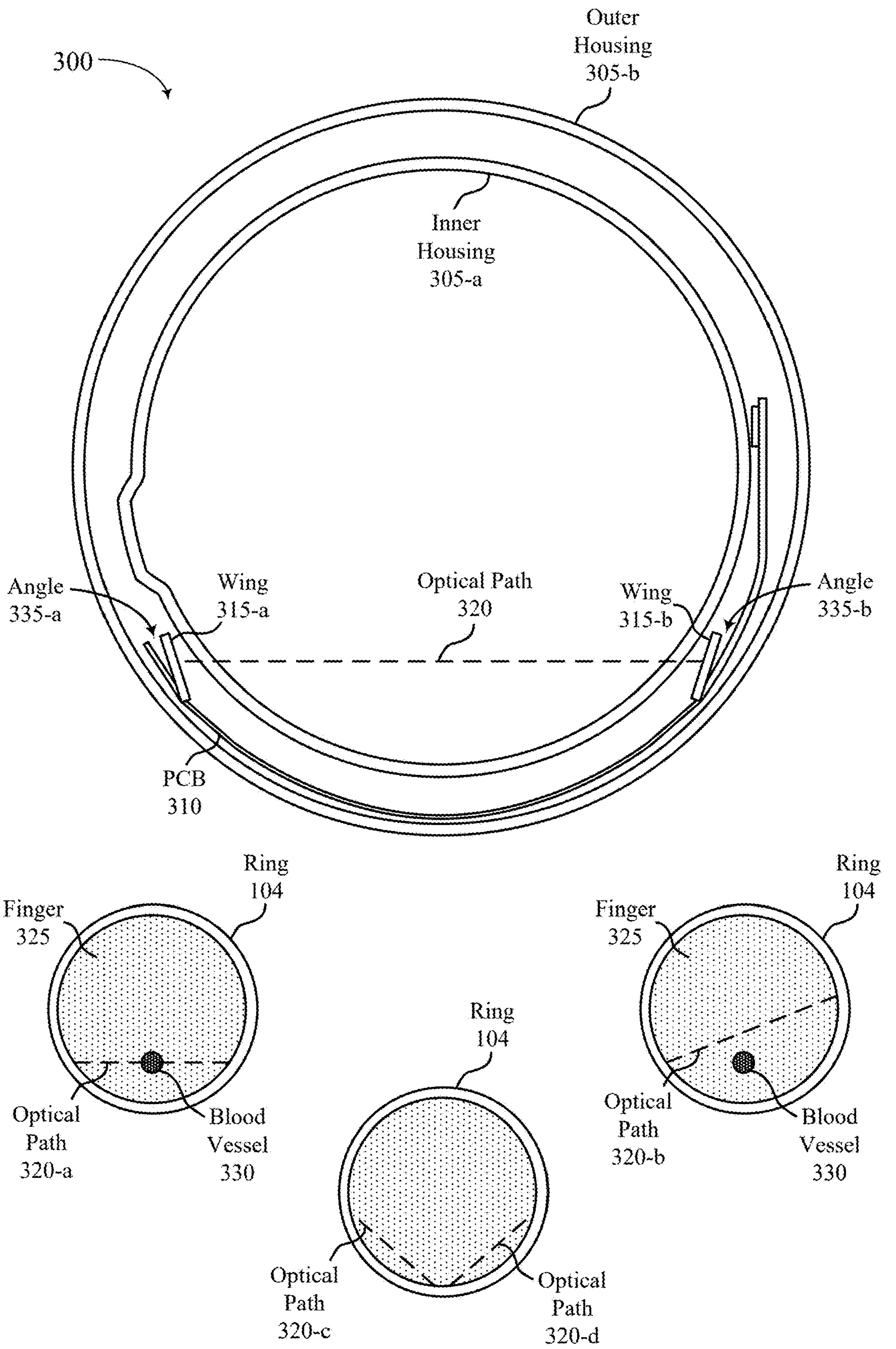
FIG. 3 shows an example of a wearable ring device that supports techniques for adjusting optical paths via angling of optoelectronic components in accordance with aspects of the present disclosure.

FIG. 3 shows an example of a wearable ring device 300 that supports techniques for adjusting optical paths via angling of optoelectronic components in accordance with aspects of the present disclosure.

As described previously, with reference to FIG. 2, the wearable ring device 300, which may be referred to as a ring 104 in the context of FIG. 3, may be defined by (e.g., include), an inner housing 305-*a* defining an inner circumference of the ring 104 and an outer housing 305-*b* defining an outer circumference of the ring 104. Additionally, the ring 104 may include a PCB 310 between the inner housing 305-*a* and the outer housing 305-*b* (e.g., within the ring 104), where a top surface of the PCB 310 faces the inner housing 305-*a* (e.g., the inner circumference) and a bottom surface of the PCB 310 faces the outer housing 305-*b* (e.g., the outer circumference). Additionally, the PCB 310 may include one or more wings 315, such as a wing 315-*a* and a wing 315-*b*, where one or more electrical components, such as an LED, a PD, or both, are positioned on each wing 315. For example, a first LED may be positioned on the wing 315-*a* and a first PD may be positioned on the wing 315-*b*.

In such cases, the wings 315 may be angled relative to the PCB 310 according to one or more wing configurations, as described with reference to FIGS. 5A, 5B, and 5C, such that one or more desired (e.g., more direct, less arched, nearly straight) optical paths 320 may be formed between each LED-PD pair. For example, the wing 315-*a* may be angled relative to the top surface of the PCB 310 in a first direction according to an angle 335-*a* and the wing 315-*b* may be angled relative to the top surface of the PCB 310 in a second direction (e.g., opposite the first direction) according to an angle 335-*b*, such that an optical path 320 between the first LED and the first PD is more direct (e.g., less arched). In other words, the wing 315-*a* and the wing 315-*b* may be positioned a radial distance from each other (e.g., on opposite sides of the ring 104, opposite each other) and the angle 335-*a* and the angle 335-*b* may be selected such that the first LED and the first PD are perpendicular or nearly perpendicular to (e.g., within a threshold degree of perpendicularity of) each other.

Thus, different LED-PD pairs may be positioned on different pairs of wings 315 positioned on different parts of the PCB 310 (e.g., and at different angles 335), such that one or more optical paths 320, such as an optical path 320-*a*, associated with a first set of LED-PDs pairs may intersect or may be within a threshold proximity of one or more pulsating blood vessels 330 of a finger 325 of a user 106 for collection of first physiological data, such as heart rate and blood pressure, and one or more optical paths 320, such as an optical path 320-*b*, associated with a second set of LED-PDs pairs may not intersect or may be beyond the threshold proximity of one or more pulsating blood vessels 330 for collection of second physiological data, such as blood oxygen saturation.

In some cases, angles 335 of each wing 315 on the PCB 310 may be based on a size of the ring 104. That is, a positions of the one or more pulsating blood vessels 330 (e.g., anatomical structures) in the finger 325 of the user 106 may be relative to a size of the finger 325, such that positions of the one or more pulsating blood vessels 330 in the finger 325 relative to the ring 104 may be determined based on the size of the finger 325 and, thus, the size of the ring 104. As such, the angles 335 of each wing 315 may be based on the size of the ring 104, such that one or more optical paths 320 associated with each wing 315 either intersect one or more pulsating blood vessels 330 or avoid one or more pulsating blood vessels 330. In such cases, the anatomical structures in the finger may include the one or more pulsating blood vessels, one or more bones, fat, muscle, tendon, ligaments, or the like thereof, and the angles 335 of each wing 315 may be selected to intersect or avoid any combination of the anatomical structures. In some examples, positions of the anatomical structures of a given user 106 may be measured (e.g., pre-determined) using imaging technology (e.g., magnetic resonant imaging, photoacoustic imaging, x-ray, ultrasound, computed tomography (CT) scan, or the like thereof), such that the angles 335 of each wing 315 may be based on the measured positions. Additionally, or alternatively, the positions of the anatomical structures of the given user 106 may determined based on average anatomical positions of a population of users 106, mathematical calculations, scientific research, or the like thereof.

Additionally, in some cases, one or more apertures of the ring 104 (e.g., not depicted) may be based on one or more wings 315 of the PCB 310. That is, the ring 104 may include one or more apertures that are each associated with a dome (e.g., or other passive optical component, such as a conical mirror or Fresnel lens) extruding from the inner housing 305-*a* of the ring 104, such that light transmitted by each LED of the ring 104 may exit the ring 104 (e.g., through a respective first dome), go through the finger 325 of the user 106, and enter the ring 104 to be received by a PD of the ring 104 (e.g., through a respective second dome). Thus, in some cases, a distance that each dome extrudes from the inner housing 305-*a* (e.g., a distance between the inner circumference of the ring 104 and a peak of each dome) may be based on an angle 335 of a respective wing 315 associated with the respective dome. That is, in some cases, an angle 335 of a wing 315 may result in at least a portion of the wing 315 (e.g., and/or an electrical component positioned on the wing 315, such as one or more LEDs, one or more PDs, or both) extending past the inner circumference of the ring 104, into an associated dome, such that the distance the dome extrudes from the inner housing 305-*a* (e.g., from the inner circumference) is based on how far the wing 315 extends, which is further based on the angle 335.

Additionally, or alternatively, one or more domes (e.g., or other passive optical component) of the ring 104 may further be used to alter associated optical paths 320 (e.g., an optical path 320 associated with an LED, PD, or both, associated with a dome). For example, different shapes of domes may be associated with different emission patterns, such that some domes may result in a field of view of an LED, a PD, or both, being more narrow as compared to some other domes. Additionally, or alternatively, one or more structures (e.g., reflector structures) on each LED may alter one or more optical paths 320 associated with the LED. That is, an optical path 320 associated with an LED may be based on the one or more structures (e.g., a position of the one or more structures), such that the one or more structures may define a direction of the optical path 320 (e.g., may make the optical path 320, or "beam," more directional, as compared to one or more other structures).

Additionally, or alternatively, a PD and an LED positioned within the threshold proximity of each other may be positioned on wings 315, where the wings 315 are angled to avoid interference. That is, in some cases, when an LED and a PD of an LED-PD pair are positioned within a first threshold proximity of each other (e.g., too short of a distance), a threshold quantity of light (e.g., too much light) may reflect from a top layer of skin of a user 102 (e.g., that doesn't pulse), such that a SNR of a signal associated with the LED-PD pair may drop below a threshold SNR (e.g., SNR becomes too low for quality measurements). Thus, the LED and PD (e.g., within the first threshold proximity of each other) may be positioned on wings 315, where the wings 315 are angled such that an optical path 320 between the LED and the PD penetrates deeper into a finger of the user 102 (e.g., as compared to the LED and the PD not being positioned on wings 315), reducing the quantity of light reflected from the top layer of skin of the user 102 (e.g., improving measurement quality). In some other cases, an LED and a PD may not be part of an LED-PD pair (e.g., may not be intended to communicate) but may be within a second threshold proximity of each other, such that light output by the LED may be received by the PD as interference. Thus, the LED, the PD, or both, (e.g., within the second threshold proximity of each other) may be positioned on one or more wings 315 that are tilted away from each other, such that interference experienced by the PD is reduced. In other words, the wings 315 may be angled away from each other in such a way that light transmitted along an optical path 320-*c* does not interfere with second light received by the PD along an optical path 320-*d*.

Additionally, or alternatively, wings 315 on the ring 104 may enable a distance between an LED and a PD of an LED-PD pair to be reduced while maintaining a same depth, a same length, or both, of an optical path 320 (e.g., as compared to a ring 104 without wings 315). That is, without wings 315, an LED and a PD of an LED-PD pair may be positioned a first radial distance from each other, such that a first optical path 320 between the LED and the PD may be associated with a first length and a first depth. However, with wings 315, the LED and the PD of the LED-PD pair may be positioned at a second radial distance from each other producing a second optical path 320 between the LED and the PD, where the second optical path 320 maintains the first length, the first depth, or both, (e.g., associated with a threshold signal quality) based on angling of the wings 315 on which the LED, the PD, or both, are positioned. Reducing radial distances between LEDs and PDs of LED-PD pairs may, thus, result in saving space within the ring 104 (e.g., less space required for housing the LED-PD pairs), where the saved space may be used by other components (e.g., more components, larger components, a larger battery).

Figure 4:
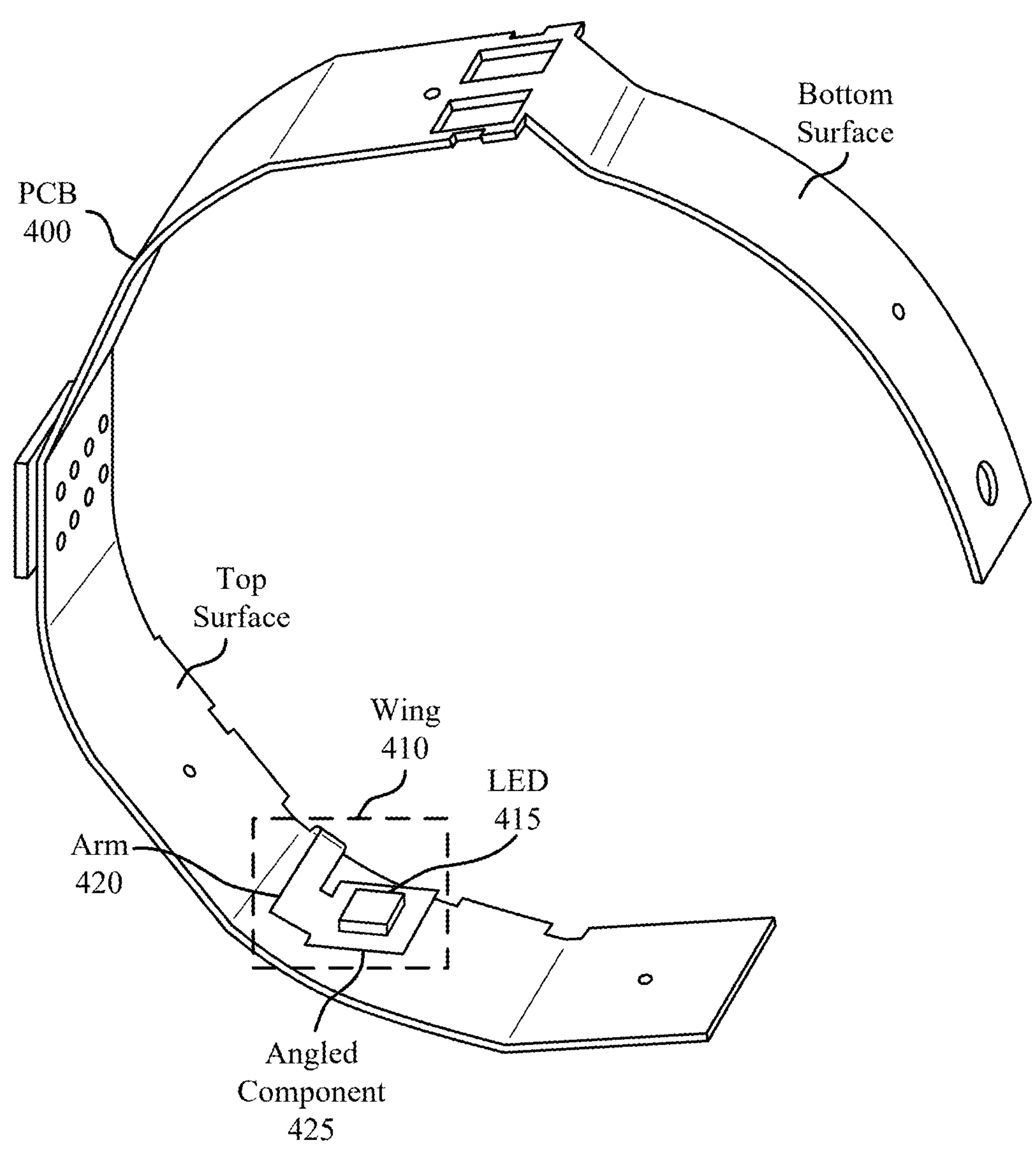
FIG. 4 shows an example of a printed circuit board (PCB) that supports techniques for adjusting optical paths via angling of optoelectronic components in accordance with aspects of the present disclosure.

FIG. 4 shows an example of a PCB 400 that supports techniques for adjusting optical paths via angling of optoelectronic components in accordance with aspects of the present disclosure.

As described previously, with reference to FIG. 2, a ring 104 may include an inner housing defining an inner circumference of the ring 104 and an outer housing defining an outer circumference of the ring 104. Additionally, the ring 104 may include a PCB 400, where a top surface of the PCB 400 faces the inner housing and a bottom surface of the PCB 310 faces the outer housing.

Additionally, as described previously, with reference to FIG. 3, the PCB 400 may include one or more wings 410 angled relative to the PCB 400, such that one or more electrical components positioned on a top surface (e.g., top face, facing the inner housing) of each wing 410, such as an LED 415, may also be angled relative to the PCB 400. For example, as described further with reference to FIGS. 5A, 5B, and 5C, each wing 410 may include an arm 420 (e.g., an arm component, a first portion of the wing 410) that extrudes from a side of the PCB 400 and an angled component 425 (e.g., a second portion of the wing 410) that is angled relative to the PCB 400. In such cases, in a bent position (e.g., manufactured position), the arm 420 may bend back over the top surface (e.g., face) of the PCB 400, such that the top surface of the angled component 425 faces (e.g., at least partially) the inner housing and a bottom surface of the angled component 425 faces (e.g., at least partially) the top surface of the PCB 400. Thus, the wing 410 may be defined by an angle between the bottom face of the wing 410 and the top face of the PCB 400.

Though depicted in the context of the LED 415, this is not to be regarded as a limitation of the present disclosure. In this regard, any electrical component or set of electrical components may be positioned on the wing 410 (e.g., the top surface of the angled component 425, the bottom surface of the angled component 425, a top surface of the arm 420, a bottom surface of the arm 420, or any combination thereof.). Additionally, or alternatively, though depicted in the context of a single wing 410, this is not to be regarded as a limitation of the present disclosure. In this regard, the PCB 400 may support any quantity of wings 410 in any combination of wing configurations, as described further with reference to FIGS. 5A, 5B, and 5C.

Figure 5A:
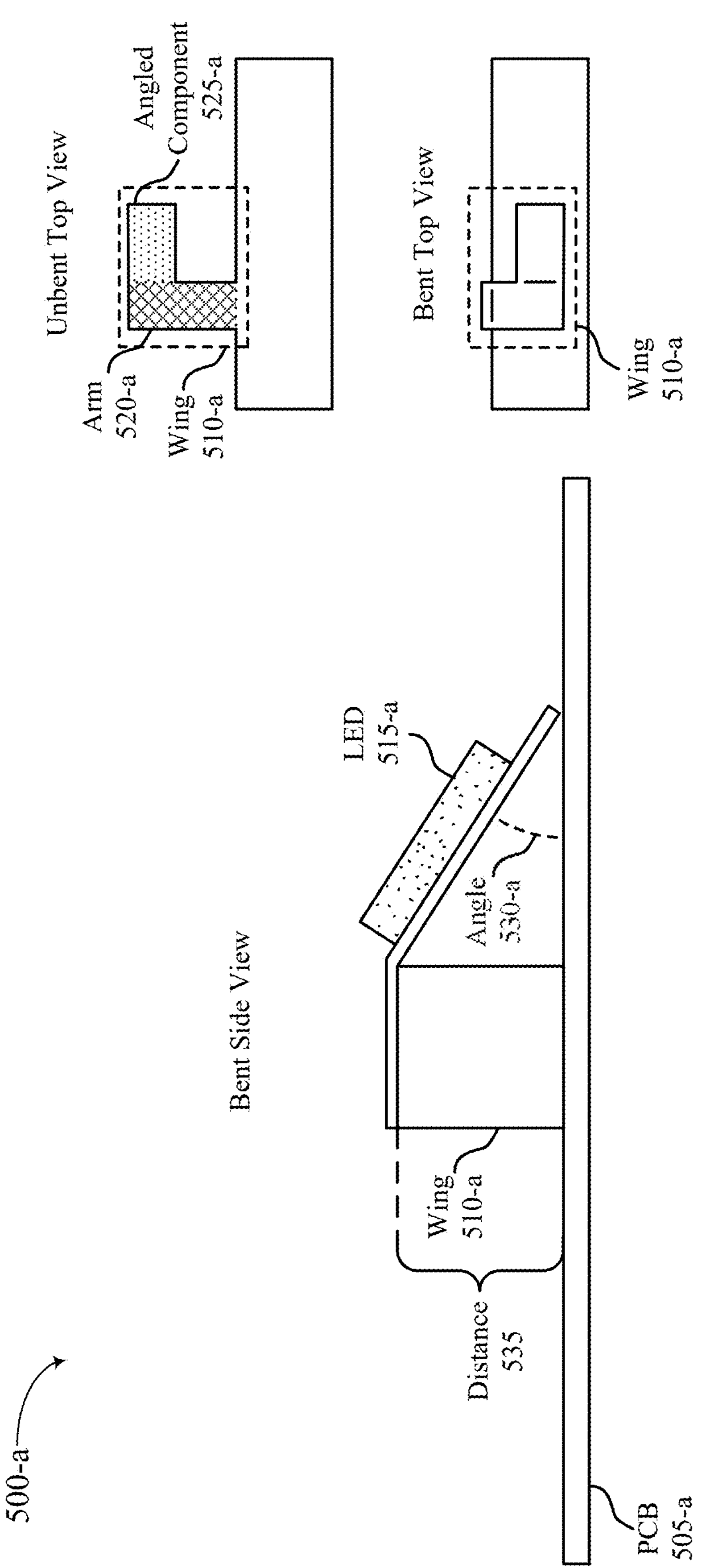
FIGS. 5A, 5B, and 5C show examples of wing configurations that support techniques for adjusting optical paths via angling of optoelectronic components in accordance with aspects of the present disclosure.
Figure 5B:
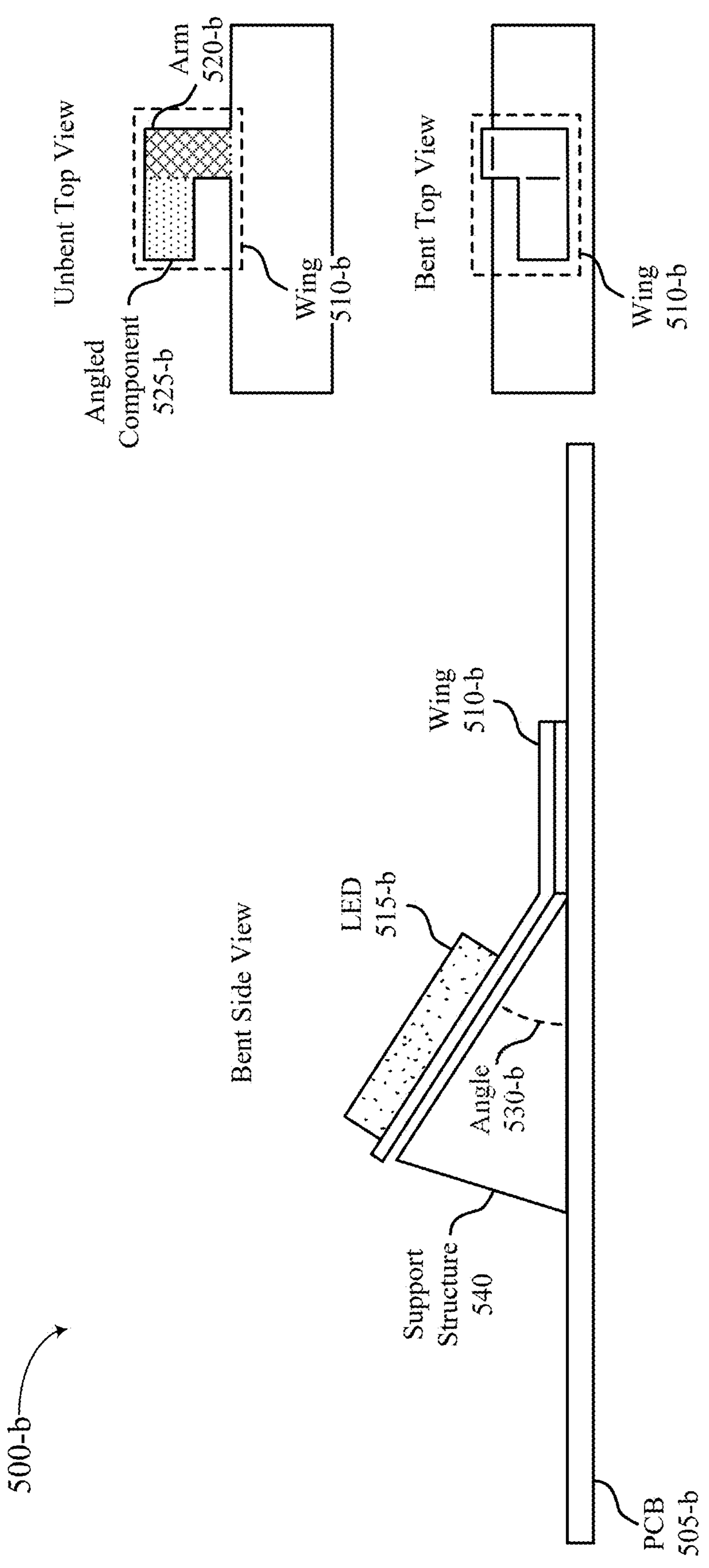
Figure 5C:
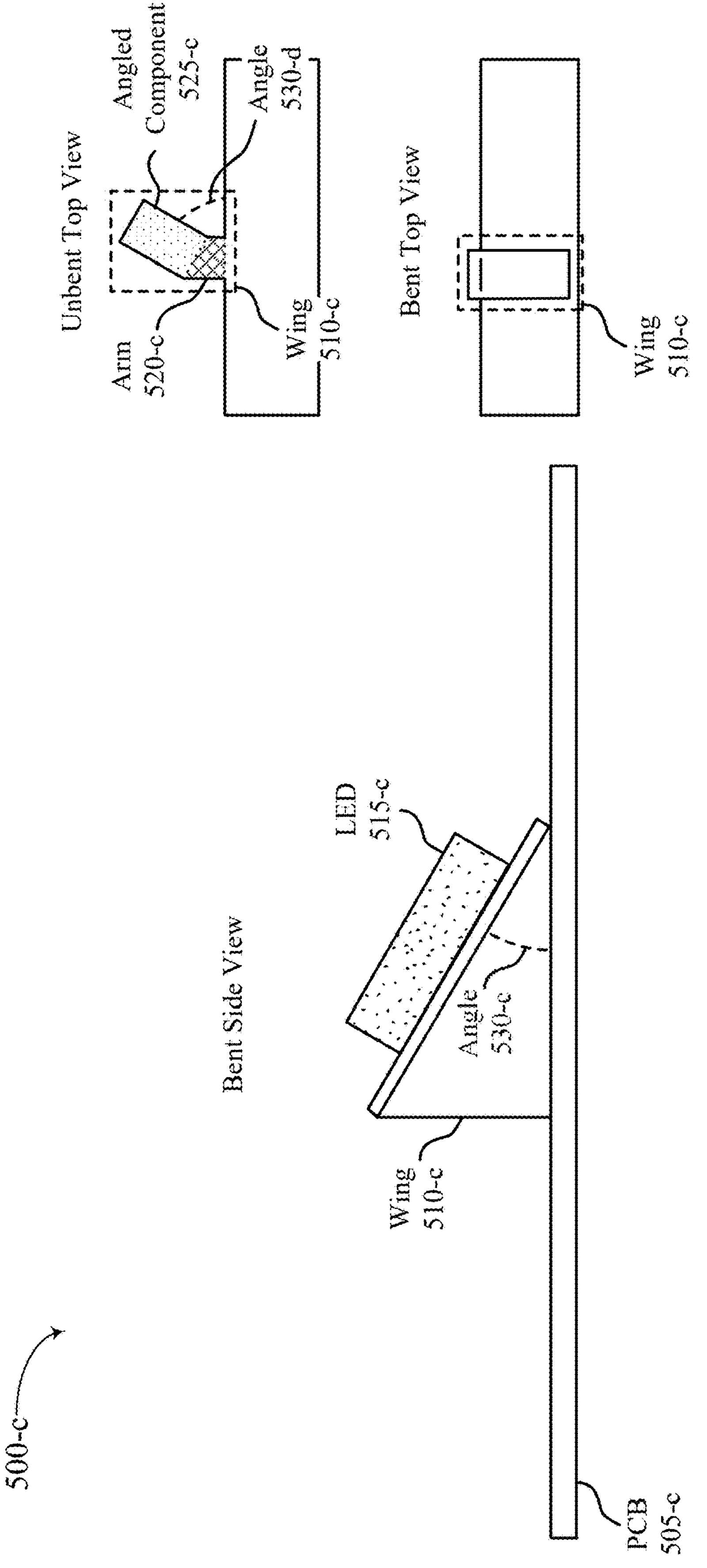

FIGS. 5A, 5B, and 5C show examples of wing configurations 500 (e.g., a wing configuration 500-*a*, a wing configuration 500-*b*, and a wing configuration 500-*c*) that supports techniques for adjusting optical paths via angling of optoelectronic components in accordance with aspects of the present disclosure.

As described with reference to FIGS. 3 and 4, a PCB 505 of a ring 104 may include one or more wings 510 on which one or more LEDs 515, one or more PDs, or both, are positioned, where at least a portion of each wing 510 (e.g., an angled component 525 of each wing 510) may be angled relative to a top surface of the PCB 505 (e.g., a surface facing an inner circumference of the ring 104) according to a wing configuration 500. The one or more wings 510 of the ring 104 may be associated with any combination of wing configurations 500.

In some cases, according to the wing configuration 500-*a*, at least a portion of a wing 510-*a* (e.g., an angled component 525-*c* of the wing 510-*b*) may be angled relative to a top surface of a PCB 505-*a* based on a downward bend of the portion of the wing 510-*a*. That is, in an unbent position of the wing 510-*a* (e.g., prior to manufacturing, during manufacturing), as depicted in an unbent top view of the wing configuration 500-*a*, the wing 510-*a* may include an arm component (e.g., a first portion of the wing 510-*a*), which may be referred to as an arm 520-*a*, extruding from the side of the PCB 505-*a* (e.g., connected to the PCB 505-*a* at a first end of the arm 520-*a*), such that the arm 520-*a* is perpendicular to a side of the PCB 505-*a*. Additionally, in the unbent position, the wing 510-*a* may include the angled component 525-*a* (e.g., a second portion of the wing 510-*a*) connected to a side (e.g., second end, opposite end) of the arm 520-*a*, such that the angled component 525-*a* is parallel to a side of the PCB 505-*a*. Thus, in a bent position of the wing 510-*a* (e.g., in a final form within the ring 104, after manufacturing), as depicted in a bent top view and a bent side view of the wing configuration 500-*a*, the arm 520-*a* may be bent back over the top surface of the PCB 505-*a*, according to a first set of bends, and the angled component 525-*a* may be bent downward towards the top surface of the PCB 505-*a*, according to a second set of bends. In other words, the angled component 525-*a* may be bent downwards at a first end of the angled component 525-*a* that connects to the arm 520-*a* (e.g., the side of the arm 520-*a*), such that a second end of the angled component 525-*a*, that does not connect to the arm 520-*a* (e.g., is free), is within a threshold proximity of the top surface of the PCB 505-*a*. Thus, the angled component 525-*a* may form an angle 530-*a* relative to the top surface of the PCB 505-*a*, such that an LED 515-*a* positioned on the angled component 525-*a* (e.g., perpendicular to the angled component 525-*a*) may be angled relative to the top surface of the PCB 505-*a* (e.g., at or within a threshold degree of the angle 530-*a*). In such cases, the angle 530-*a* may be based on a desired optical path associated with the LED 515-*a*. Additionally, or alternatively, the angle 530-*a* may be based on a distance 535 between at least a portion of a bottom surface of the arm 520-*a* (e.g., in the bent position) and the top surface of the PCB 505-*a*.

Additionally, or alternatively, according to the wing configuration 500-*a*, at least a portion of a wing 510-*b* (e.g., an angled component 525-*b* of the wing 510-*b*) may be angled relative to a top surface of a PCB 505-*b* based on an upward bend of the portion of the wing 510-*b*. That is, in an unbent position of the wing 510-*b* (e.g., prior to manufacturing, during manufacturing), as depicted in an unbent top view of the wing configuration 500-*b*, the wing 510-*a* may include an arm component (e.g., a first portion of the wing 510-*b*), which may be referred to as an arm 520-*b*, extruding from the side of the PCB 505-*b* (e.g., connected to the PCB 505-*b* at a first end of the arm 520-*b*), such that the arm 520-*b* is perpendicular to a side of the PCB 505-*b*. Additionally, in the unbent position, the wing 510-*b* may include the angled component 525-*b* (e.g., a second portion of the wing 510-*b*) connected to a side (e.g., second end, opposite end) of the arm 520-*b*, such that the angled component 525-*b* is parallel to a side of the PCB 505-*b*. Thus, in a bent position of the wing 510-*b* (e.g., in a final form within the ring 104, after manufacturing), as depicted in a bent top view and a bent side view of the wing configuration 500-*b*, the arm 520-*b* may be bent back over the top surface of the PCB 505-*b*, according to a first set of bends, and the angled component 525-*b* may be bent upwards away from the top surface of the PCB 505-*b*, according to a second set of bends. In other words, the angled component 525-*b* may be bent upwards at a first end of the angled component 525-*b* that connects to the arm 520-*b* (e.g., the side of the arm 520-*b*), such that a second end of the angled component 525-*b*, that does not connect to the arm 520-*b* (e.g., is free), is a second threshold proximity away from the top surface of the PCB 505-*b* (e.g., based on an angle 530-*b*). Thus, the angled component 525-*b* may form the angle 530-*b* relative to the top surface of the PCB 505-*b*, such that an LED 515-*b* positioned on the angled component 525-*b* (e.g., perpendicular to the angled component 525-*b*) may be angled relative to the top surface of the PCB 505-*b* (e.g., at or within a threshold degree of the angle 530-*b*). In some cases, the ring 104 may further include a support structure 540 beneath the wing 510-*b* (e.g., between the top surface of the PCB 505-*b* and the angled component 525-*b*), such that the wing 510-*b* may maintain the angle 530-*b* (e.g., under application of a compressive force applied to the PCB 505-*b*). In such cases, the angle 530-*b* may be based on a desired optical path associated with the LED 515-*b*. Additionally, or alternatively, the angle 530-*b* may be based on a distance 535 between the second end of the angled component 525-*b* (e.g., in the bent position) and the top surface of the PCB 505-*a* (e.g., a height of the support structure 540).

Additionally, or alternatively, according to the wing configuration 500-*c*, at least a portion of a wing 510-*c* (e.g., an angled component 525-*c*) may be angled relative to a top surface of a PCB 505-*c* based on an angle 530-*d* of the portion of the wing 510-*c* relative to a side of the PCB 505-*c* prior to bending. That is, in an unbent position of the wing 510-*c* (e.g., prior to manufacturing, during manufacturing), as depicted in an unbent top view of the wing configuration 500-*c*, the wing 510-*c* may include an arm component (e.g., a first portion of the wing 510-*c*), which may be referred to as an arm 520-*c*, extruding from the side of the PCB 505-*c* (e.g., connected to the PCB 505-*c* at a first end of the arm 520-*c*), such that the arm 520-*c* is perpendicular to a side of the PCB 505-*c*. Additionally, in the unbent position, the wing 510-*c* may include the angled component 525-*c* (e.g., a second portion of the wing 510-*c*) connected to a second end of the arm 520-*c* (e.g., at an angle 530-*e*, not depicted, based on the angle 530-*d*), such that the angled component 525-*c* is at the angle 530-*d* relative to the side of the PCB 505-*c* (e.g., in the unbent position). Thus, in a bent position of the wing 510-*c* (e.g., in a final form within the ring 104, after manufacturing), as depicted in a bent top view and a bent side view of the wing configuration 500-*c*, the arm 520-*c* may be bent back over the top surface of the PCB 505-*c*, according to a first set of bends. Thus, due to the angle 530-*d* of the angled component 525-*c* relative to the side of the PCB 505-*c* prior to bending, the angled component 525-*c* may form an angle 530-*c* relative to the top surface of the PCB 505-*c* when the arm 520-*c* is bent back over the top surface of the PCB 505-*c*. In such cases, the angle 530-*c* may be based on a desired optical path associated with the LED 515-*c*. Additionally, or alternatively, the angle 530-*c* may be based on the angle 530-*d*.

Though depicted as LEDs 515 on wings 510, this is not to be regarded as a limitation of the present disclosure. In this regard, any electrical component or set of electrical components, including PDs, may be positioned on a wing 510 in any of the wing configurations 500.

It should be noted that the methods described above describe possible implementations, and that the operations and the steps may be rearranged or otherwise modified and that other implementations are possible. Furthermore, aspects from two or more of the methods may be combined.

A wearable ring device is described. The wearable ring device may include a ring-shaping housing defining an inner circumference of the wearable ring device and an outer circumference of the wearable ring device, where the ring-shaped housing includes a set of multiple apertures in the inner circumference of the wearable ring device, a PCB disposed within the ring-shaped housing, where the PCB wraps at least partially around the inner circumference of the wearable ring device, and where a top face of the PCB faces the inner circumference of the wearable ring device, the PCB comprising, a set of multiple optoelectronic components comprising at least a first light emitting component positioned on a first wing of the PCB and at least a first light detecting component, the first wing extruding from the PCB in a first direction and in accordance with a first angle between a bottom face of the first wing and the top face of the PCB, where the first light emitting component is positioned on a top face of the first wing, and where a first optical path is defined between the first light emitting component and the first light detecting component based at least in part on the first angle.

In some examples of the wearable ring device described herein, the first light detecting component may be positioned on a second wing of the PCB, the second wing extruding from the PCB in a second direction at least partially opposite the first direction and in accordance with a second angle between a bottom face of the second wing and the top face of the PCB, where the first light detecting component is positioned on a top face of the second wing, and where a first optical path is defined between the first light emitting component and the first light detecting component based at least in part on the first angle and the second angle.

In some examples of the wearable ring device described herein, each of the first wing and the second wing may extrude from a side of the PCB and bend back over the top face of the PCB.

In some examples of the wearable ring device described herein, each of the first wing and the second wing may include an arm component extruding from the side of the PCB, where the arm component bends back over the top face of the PCB and an angled component coupled to the arm component at a first end, where a respective optoelectronic component may be positioned on a top face of the angled component, and where a respective angle may be formed between a bottom face of the angled component and the top face of the PCB.

In some examples of the wearable ring device described herein, the angled component may tilt downward from the first end of the angled component to a second end of the angled component and the respective angle may be based at least in part on the tilting.

In some examples of the wearable ring device described herein, the first wing extruding from the PCB in the first direction may be based at least in part on a first angled component of the first wing tilting downwards in a direction of the second wing and the second wing extruding from the PCB in the second direction may be based at least in part on a second angled component of the second wing tilting downwards in a direction of the first wing.

In some examples of the wearable ring device described herein, the angled component may tilt upward from the first end of the angled component to a second end of the angled component and the respective angle may be based at least in part on the tilting.

In some examples of the wearable ring device described herein, the first wing extruding from the PCB in the first direction may be based at least in part on a first angled component of the first wing tilting upwards in a direction away from the second wing and the second wing extruding from the PCB in the second direction may be based at least in part on a second angled component of the second wing tilting upwards in a direction away from of the first wing.

In some examples of the wearable ring device described herein, the angled component may be coupled to the arm component at a third angle and the respective angle may be based at least in part on the third angle.

In some examples of the wearable ring device described herein, the first wing extruding from the PCB in the first direction may be based at least in part on the third angle causing a first angled component of the first wing to angle towards the second wing and the second wing extruding from the PCB in the second direction may be based at least in part on the third angle causing a second angled component of the second wing to angle towards the first wing.

In some examples of the wearable ring device described herein, the PCB may include a first support structure positioned between the bottom face of the first wing and the top face of the PCB, where the first angle may be based at least in part on a size of the first support structure and a second support structure positioned between the bottom face of the second wing and the top face of the PCB, where the second angle may be based at least in part on a size of the second support structure.

In some examples of the wearable ring device described herein, the first optical path may be within a threshold proximity of a blood vessel of a user based at least in part on the first angle and the second angle.

In some examples of the wearable ring device described herein, the first optical path may be associated with measuring heart rate, blood pressure, or both.

In some examples of the wearable ring device described herein, the first optical path may be beyond a threshold proximity of a blood vessel of a user based at least in part on the first angle and the second angle.

In some examples of the wearable ring device described herein, the first optical path may be associated with measuring blood oxygen saturation.

In some examples of the wearable ring device described herein, the wearable ring device may include a third wing, within a threshold proximity of the first wing, extruding from the PCB in the second direction and in accordance with a third angle between a bottom face of the third wing and the top face of the PCB, where a second light detecting component may be positioned on a top face of the third wing, and where interference between the first light emitting component and the second light detecting component may be less than a threshold based at least in part on the first angle relative to the third angle.

In some examples of the wearable ring device described herein, the set of multiple optoelectronic components may further include a second light emitting component positioned on a third wing of the PCB and a second light detecting component positioned on a first wing of the PCB. In such cases, the PCB may further include the third wing extruding from the PCB in a third direction and in accordance with a third angle between a bottom face of the third wing and the top face of the PCB, where the second light emitting component may be positioned on a top face of the third wing and the fourth wing extruding from the PCB in a fourth direction at least partially opposite the third direction and in accordance with a fourth angle between a bottom face of the fourth wing and the top face of the PCB, where the second light detecting component may be positioned on a top face of the fourth wing, and where a second optical path may be defined between the second light emitting component and the second light detecting component based at least in part on the third angle and the fourth angle.

In some examples of the wearable ring device described herein, the third direction may be the same as the first direction and the fourth direction may be the same as the second direction.

In some examples of the wearable ring device described herein, the third direction may be the same as the second direction and the fourth direction may be the same as the first direction.

In some examples of the wearable ring device described herein, the first light emitting component may be perpendicular to the first light detecting component based at least in part on the first angle and the second angle.

In some examples of the wearable ring device described herein, the wearable ring device may be a smart ring.

The description set forth herein, in connection with the appended drawings, describes example configurations and does not represent all the examples that may be implemented or that are within the scope of the claims. The term “exemplary” used herein means “serving as an example, instance, or illustration,” and not “preferred” or “advantageous over other examples.” The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable ROM (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A wearable ring device, comprising:

a housing defining an inner surface of the wearable ring device and an outer surface of the wearable ring device, wherein the housing comprises a plurality of apertures within the inner surface of the wearable ring device; and a printed circuit board disposed within the housing, wherein the printed circuit board wraps at least partially around the wearable ring device within the housing, and wherein a top face of the printed circuit board faces the inner surface of the wearable ring device, the printed circuit board comprising:

a plurality of optoelectronic components comprising at least a first light emitting component positioned on a first wing of the printed circuit board and at least a first light detecting component;

wherein the first wing extrudes from a side of the printed circuit board and bends over the top face of the printed circuit board in a first bent position associated with a first angle between a bottom face of the first wing and the top face of the printed circuit board, wherein the first light emitting component is positioned on a top face of the first wing, and wherein a first optical path is defined between the first light emitting component and the first light detecting component based at least in part on the first angle.

2. The wearable ring device of claim 1, wherein the first light detecting component is positioned on a second wing of the printed circuit board, wherein the second wing extrudes from the side of the printed circuit board and bends over the top face of the printed circuit board in a second bent position associated with a second angle between a bottom face of the second wing and the top face of the printed circuit board, wherein the first light detecting component is positioned on a top face of the second wing, and wherein the first optical path is defined between the first light emitting component and the first light detecting component based at least in part on the first angle and the second angle.

3. The wearable ring device of claim 2, wherein each of the first wing and the second wing comprise:

an arm component extruding from the side of the printed circuit board, wherein the arm component bends back over the top face of the printed circuit board; and an angled component coupled to the arm component at a first end, wherein a respective optoelectronic component is positioned on a top face of the angled component, and wherein a respective angle is formed between a bottom face of the angled component and the top face of the printed circuit board.

4. The wearable ring device of claim 3, wherein each angled component tilts downward from the first end of the angled component to a second end of the angled component, and wherein the respective angle is based at least in part on the tilting.

5. The wearable ring device of claim 4, wherein the first wing extruding from the printed circuit board is based at least in part on a first angled component of the first wing tilting downwards in a direction of the second wing, and wherein the second wing extruding from the printed circuit board is based at least in part on a second angled component of the second wing tilting downwards in a direction of the first wing.

6. The wearable ring device of claim 3, wherein each angled component tilts upward from the first end of the angled component to a second end of the angled component, and wherein the respective angle is based at least in part on the tilting.

7. The wearable ring device of claim 6, wherein the first wing extruding from the printed circuit board is based at least in part on a first angled component of the first wing tilting upwards in a direction away from the second wing, and wherein the second wing extruding from the printed circuit board is based at least in part on a second angled component of the second wing tilting upwards in a direction away from of the first wing.

8. The wearable ring device of claim 3, wherein each angled component is coupled to the arm component at a third angle, and wherein the respective angle is based at least in part on the third angle.

9. The wearable ring device of claim 8, wherein the first wing extruding from the printed circuit board is based at least in part on the third angle causing a first angled component of the first wing to angle towards the second wing, and wherein the second wing extruding from the printed circuit board is based at least in part on the third angle causing a second angled component of the second wing to angle towards the first wing.

10. The wearable ring device of claim 2, wherein the printed circuit board further comprises:

a first support structure positioned between the bottom face of the first wing and the top face of the printed circuit board, wherein the first angle is based at least in part on a size of the first support structure; and a second support structure positioned between the bottom face of the second wing and the top face of the printed circuit board, wherein the second angle is based at least in part on a size of the second support structure.

11. The wearable ring device of claim 2, wherein the first optical path is within a threshold proximity of a blood vessel of a user based at least in part on the first angle and the second angle.

12. The wearable ring device of claim 11, wherein the first optical path is associated with measuring heart rate, blood pressure, or both.

13. The wearable ring device of claim 2, wherein the first optical path is beyond a threshold proximity of a blood vessel of a user based at least in part on the first angle and the second angle.

14. The wearable ring device of claim 13, wherein the first optical path is associated with measuring blood oxygen saturation.

15. The wearable ring device of claim 2, wherein the printed circuit board further comprises a third wing, within a threshold proximity of the first wing, that extrudes from the printed circuit board and bends over the top face of the printed circuit board in a third bent position associated with a third angle between a bottom face of the third wing and the top face of the printed circuit board, wherein a second light detecting component is positioned on a top face of the third wing, and wherein interference between the first light emitting component and the second light detecting component is less than a threshold based at least in part on the first angle relative to the third angle.

16. The wearable ring device of claim 2, wherein the plurality of optoelectronic components further comprise a second light emitting component positioned on a third wing of the printed circuit board and a second light detecting component positioned on a fourth wing of the printed circuit board, wherein the third wing extrudes from the printed circuit board and bends over the top face of the printed circuit board in a third bent position associated with a third angle between a bottom face of the third wing and the top face of the printed circuit board, wherein the second light emitting component is positioned on a top face of the third wing;

wherein the fourth wing extrudes from the printed circuit board and bends over the top face of the printed circuit board in a fourth bent position associated with a fourth angle between a bottom face of the fourth wing and the top face of the printed circuit board, wherein the second light detecting component is positioned on a top face of the fourth wing, and wherein a second optical path is defined between the second light emitting component and the second light detecting component based at least in part on the third angle and the fourth angle.

17. The wearable ring device of claim 2, wherein the first light emitting component is perpendicular to the first light detecting component based at least in part on the first angle and the second angle.

* * * * *